(12) United States Patent
Baek

(10) Patent No.: US 10,833,093 B2
(45) Date of Patent: Nov. 10, 2020

(54) SEMICONDUCTOR DEVICES

(71) Applicant: SAMSUNG ELECTRONICS CO., LTD., Suwon-si (KR)

(72) Inventor: Seok Cheon Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/217,219

(22) Filed: Dec. 12, 2018

(65) Prior Publication Data
US 2019/0348425 A1 Nov. 14, 2019

(30) Foreign Application Priority Data
May 9, 2018 (KR) ........................ 10-2018-0052966

(51) Int. Cl.
| | | |
|---|---|---|
| *H01L 27/11582* | (2017.01) | |
| *H01L 27/11521* | (2017.01) | |
| *H01L 27/11556* | (2017.01) | |
| *H01L 29/66* | (2006.01) | |
| *H01L 29/78* | (2006.01) | |
| *H01L 27/11568* | (2017.01) | |

(52) U.S. Cl.
CPC .. *H01L 27/11521* (2013.01); *H01L 27/11556* (2013.01); *H01L 27/11568* (2013.01); *H01L 27/11582* (2013.01); *H01L 29/66666* (2013.01); *H01L 29/7827* (2013.01)

(58) Field of Classification Search
CPC ........... H01L 27/11582; H01L 27/1157; H01L 27/11556; H01L 27/11573; H01L 27/115; H01L 27/11524; H01L 27/11578; H01L 27/2481
See application file for complete search history.

(56) References Cited

U.S. PATENT DOCUMENTS

| | | |
|---|---|---|
| 9,190,514 B2 | 11/2015 | Lee et al. |
| 9,299,717 B2 | 3/2016 | Lee et al. |
| 9,640,549 B2 | 5/2017 | Lee et al. |
| 9,755,085 B2 | 9/2017 | Lee et al. |
| 9,837,434 B2 | 12/2017 | Sakata et al. |
| 2016/0163726 A1 | 6/2016 | Tanzawa |
| 2017/0207232 A1* | 7/2017 | You ...................... H01L 29/792 |
| 2017/0294388 A1 | 7/2017 | You et al. |
| 2018/0026047 A1 | 1/2018 | Park et al. |

* cited by examiner

*Primary Examiner* — Jae Lee
(74) *Attorney, Agent, or Firm* — Lee IP Law, P.C.

(57) ABSTRACT

A semiconductor device includes a substrate having first and second regions, gate electrodes stacked in a first direction perpendicular to the substrate in the first region, and extending by different lengths in a second direction perpendicular to the first direction in the second region, first separation regions in the first and second regions through the gate electrodes, extending in the second direction, and spaced apart from each other in a third direction perpendicular to the first and second directions, second separation regions between the first separation regions through the gate electrodes and extending in the second direction, portions of the second separation regions being spaced apart from each other in the second direction in the second region, and an insulation region extending in the third direction to separate at least one of the gate electrodes into portions adjacent to each other in the second direction.

18 Claims, 26 Drawing Sheets

SEMICONDUCTOR DEVICES

CROSS-REFERENCE TO RELATED APPLICATION

Korean Patent Application No. 10-2018-0052966, filed on May 9, 2018, in the Korean Intellectual Property Office, and entitled: "Semiconductor Devices," is incorporated by reference herein in its entirety.

BACKGROUND

1. Field

The present disclosure relates to a semiconductor device.

2. Description of the Related Art

Semiconductor devices are required to process large amounts of data while volumes thereof are gradually decreasing. Thus, it is necessary to increase a degree of integration of semiconductor elements constituting the semiconductor devices. Accordingly, as one method for improving the degree of integration of semiconductor devices, a semiconductor device having a vertical transistor structure instead of a conventional planar transistor structure has been proposed.

SUMMARY

According to an aspect of the present disclosure, a semiconductor device includes a substrate having first and second regions, gate electrodes that are stacked to be spaced apart from each other in a first direction perpendicular to an upper surface of the substrate in the first region, the gate electrodes extending by different lengths in a second direction perpendicular to the first direction in the second region, first separation regions arranged in the first and second regions to pass through the gate electrodes, to extend in the second direction, and to be spaced apart from each other in a third direction perpendicular to the first and second directions, second separation regions arranged between the first separation regions to pass through the gate electrodes and to extend in the second direction, portions of the second separation regions being spaced apart from each other in the second direction in the second region, and an insulation region extending in the third direction to separate at least one of the gate electrodes into two portions adjacent to each other in the second direction.

According to an aspect of the present disclosure, a semiconductor device includes memory gate electrodes that are stacked to be spaced apart from each other in a first direction, perpendicular to an upper surface of a substrate, and extend by different lengths in a second direction, perpendicular to the first direction, at least one of lower gate electrodes disposed between the substrate and the memory gate electrodes, first separation regions arranged to pass through the memory gate electrodes and at least one of the lower gate electrodes, to extend in the second direction, and to be spaced apart from each other in a third direction, perpendicular to the first and second directions, second separation regions arranged between the first separation regions to pass through the memory gate electrodes and at least one of the lower gate electrodes, to extend in parallel with the first separation regions, and arranged to be spaced apart from each other in the second direction with a gate connection region therebetween, and an insulation region separating at least one of the lower gate electrodes in the second direction, between the first separation region and the second separation region, which are adjacent to each other in the third direction.

According to an aspect of the present disclosure, a semiconductor device includes a pair of separation regions disposed on a substrate, a plurality of memory gate electrodes stacked to be spaced apart from each other in a first direction, perpendicular to an upper surface of the substrate, between the pair of separation regions, and at least one of lower gate electrodes disposed between the substrate and the memory gate electrodes, between the pair of separation regions, wherein at least one of the lower gate electrodes includes a plurality of sub-gate electrodes separated in second and third directions perpendicular to the first direction.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be described with reference to the accompanying drawings.

Figure 1:
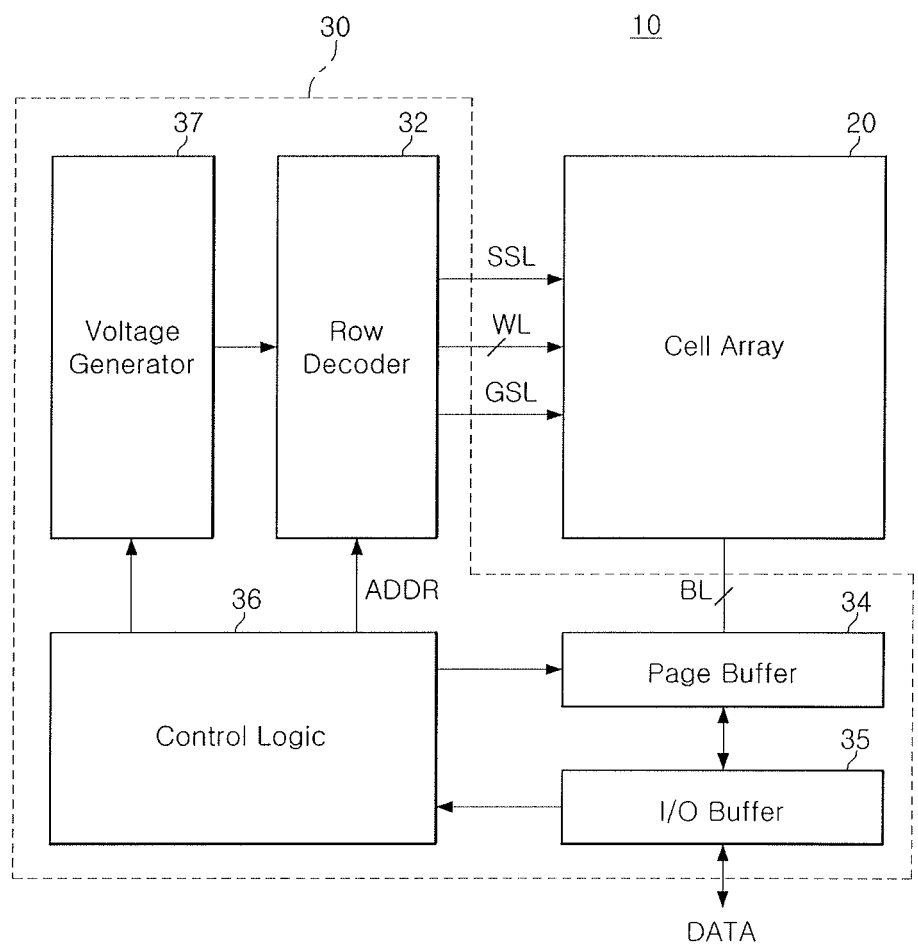
FIG. 1 illustrates a schematic block diagram of a semiconductor device according to example embodiments.

FIG. 1 is a schematic block diagram of a semiconductor device according to example embodiments.

Referring to FIG. 1, a semiconductor device 10 may include a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each memory block may include a plurality of memory cells. The plurality of memory cells may be connected to the row decoder 32 via a string selection line SSL, word lines WL, and a ground selection line GSL, and may be connected to the page buffer 34 via bit lines BL. In example embodiments, the plurality of memory cells arranged on the same row may be connected to the same word line WL, and the plurality of memory cells arranged in the same column may be connected to the same bit line BL.

The row decoder 32 may decode an input address ADDR to generate and transfer driving signals of the word line WL. The row decoder 32 may provide a word line voltage generated by the voltage generator 37 to a selected word line WL and an unselected word lines WL, respectively, in response to a control of the control logic 36.

The page buffer 34 may be connected to the memory cell array 20 via bit lines BL to read information stored in the memory cells. The page buffer 34 may temporarily store data to be stored in the memory cells, or sense data stored in the memory cells, depending on an operation mode. The page buffer 34 may include a column decoder and a sense amplifier. The column decoder may selectively activate the bit lines BL of the memory cell array 20. The sense amplifier may sense a voltage of the bit line BL selected by the column decoder during a reading operation, to read the data stored in the memory cell.

The input/output buffer 35 may receive data DATA and transfer the data DATA to the page buffer 34 in a program operation, and may output data DATA transferred from the page buffer 34 externally in a reading operation. The input/output buffer 35 may transfer an address or a command to be input to the control logic 36.

The control logic 36 may control operations of the row decoder 32 and the page buffer 34. The control logic 36 may receive a control signal and an external voltage transferred from the outside, and may operate according to the received control signal. The control logic 36 may control a reading operation, a writing operation, and/or an erasing operation in response to the control signals.

The voltage generator 37 may use an external voltage to generate voltages necessary for internal operations, for example, a program voltage, a reading voltage, an erasing voltage, and the like. A voltage generated by the voltage generator 37 may be transferred to the memory cell array 20 via the row decoder 32.

Figure 2:
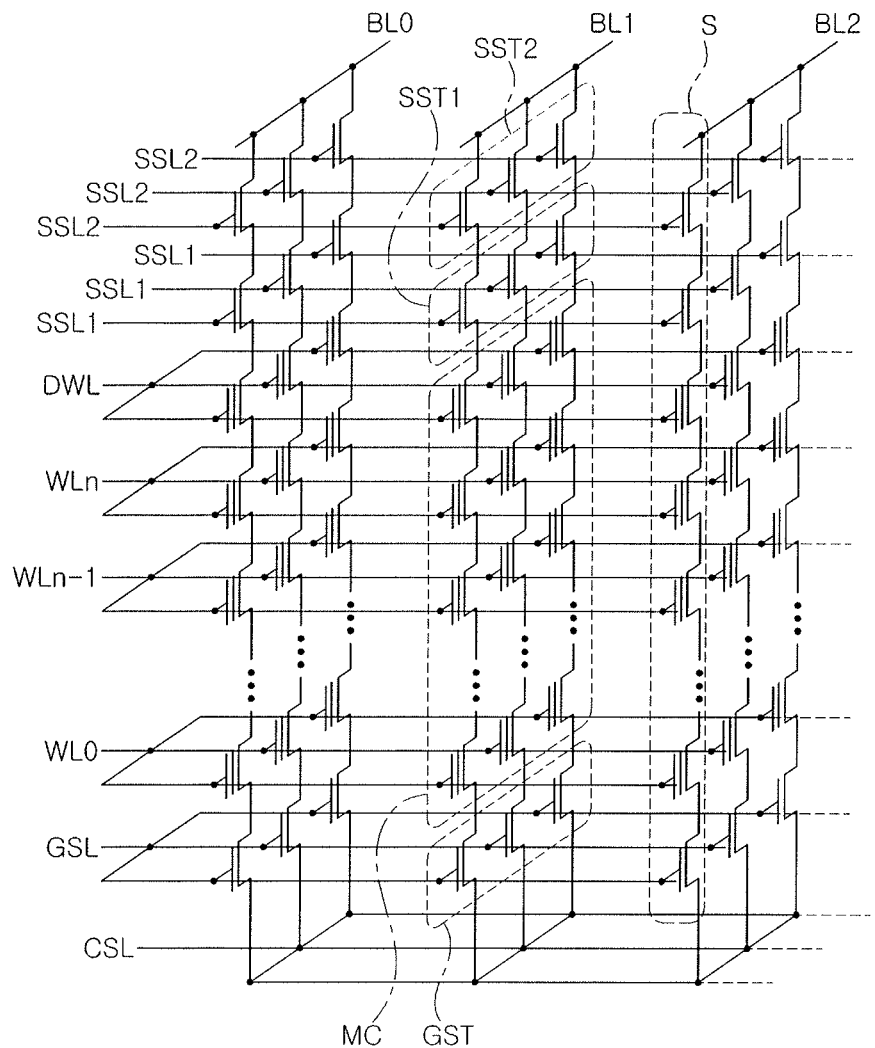
FIG. 2 illustrates an equivalent circuit diagram of a cell array of a semiconductor device according to example embodiments.

FIG. 2 is an equivalent circuit diagram of the memory cell array 20 of the semiconductor device 10 according to example embodiments.

Referring to FIG. 2, the memory cell array 20 may include a plurality of memory cell strings S including memory cells MC connected to each other in series, a ground selection transistor GST connected in series to both ends of the memory cells MC, and string selection transistors SST1 and SST2. The plurality of memory cell strings S may be connected to bit lines BL0 to BL2 in parallel, respectively. The plurality of memory cell strings S may be commonly connected to a common source line CSL. That is, the plurality of memory cell strings S may be arranged between the plurality of bit lines BL0 to BL2 and one common source line CSL. In an example embodiment, the common source line CSL may be arranged in plural, two-dimensionally.

The memory cells MC, connected to each other in series, may be controlled by word lines WL0 to WLn for selecting the memory cells MC. Each memory cell MC may include a data storage element. Gate electrodes of the memory cells MC arranged at substantially the same distance from the common source line CSL may be commonly connected to one of the word lines WL0 to WLn to be in an equipotential state. Alternatively, although the gate electrodes of the memory cells MC are arranged at substantially the same distance from the common source lines CSL, the gate electrodes arranged in different rows or columns from each other may be independently controlled.

The ground selection transistor GST may be controlled by the ground selection line GSL, and may be connected to the common source line CSL. The string selection transistors SST1 and SST2 may be controlled by string selection lines SSL1 and SSL2, and may be connected to the bit lines BL0 to BL2. Although one of the ground selection transistor GST and two of the string selection transistors SST1 and SST2 connected to the plurality of memory cells MC connected in series are illustrated in FIG. 2, one of the transistors SST1 and SST2 may be connected thereto, respectively, or a plurality of the ground selection transistors GST may be connected thereto, respectively. One or more dummy lines DWL, or a buffer line, may be further disposed between an uppermost word line WLn among the word lines WL0 to WLn and the string selection lines SSL1 and SSL2. In an example embodiment, the one or more dummy lines DWL may be disposed between a lowermost word line WL0 and the ground selection line GSL.

When a signal is applied to the string selection transistors SST1 and SST2 via the string selection lines SSL1 and SSL2, a signal applied through the bit lines BL0 to BL2 may be transferred to the memory cells MC, connected to each other in series, to perform a reading operation and a writing operation. Further, by applying a predetermined erasing voltage through the substrate, an erasing operation for erasing data recorded in the memory cells MC may be performed. In an example embodiment, the memory cell array 20 may include at least one of the dummy memory cell strings that may be electrically separated from the bit lines BL0-BL2.

Figure 3:
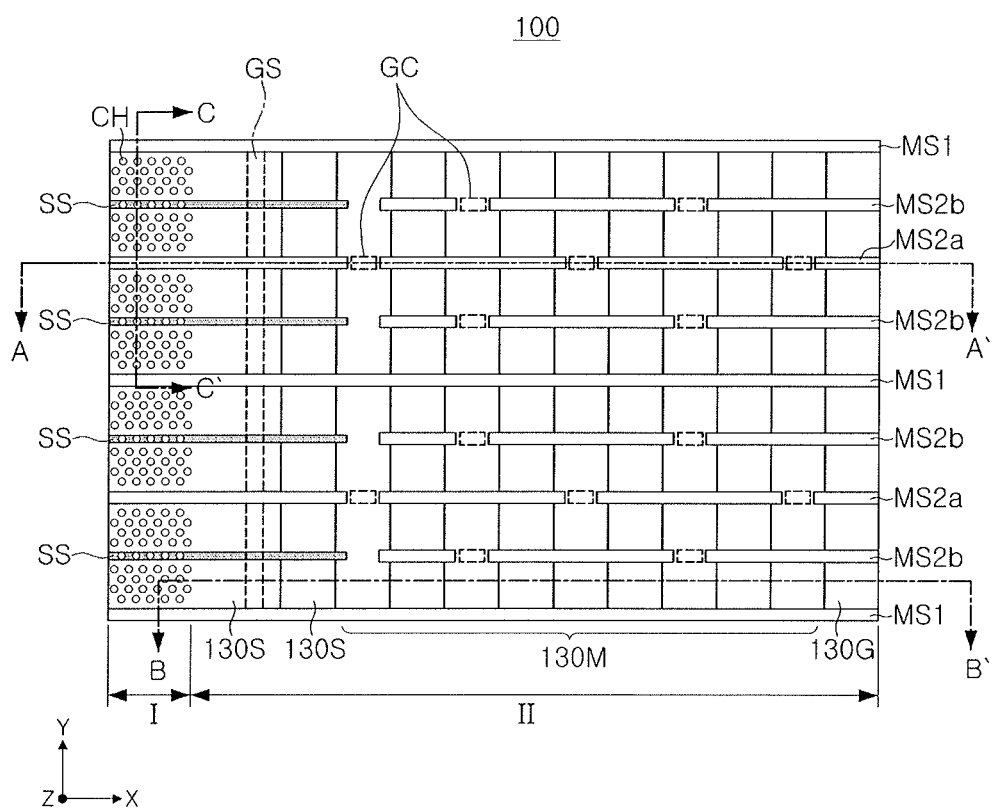
FIG. 3 illustrates a schematic plan view of a semiconductor device according to example embodiments.
Figure 4A:
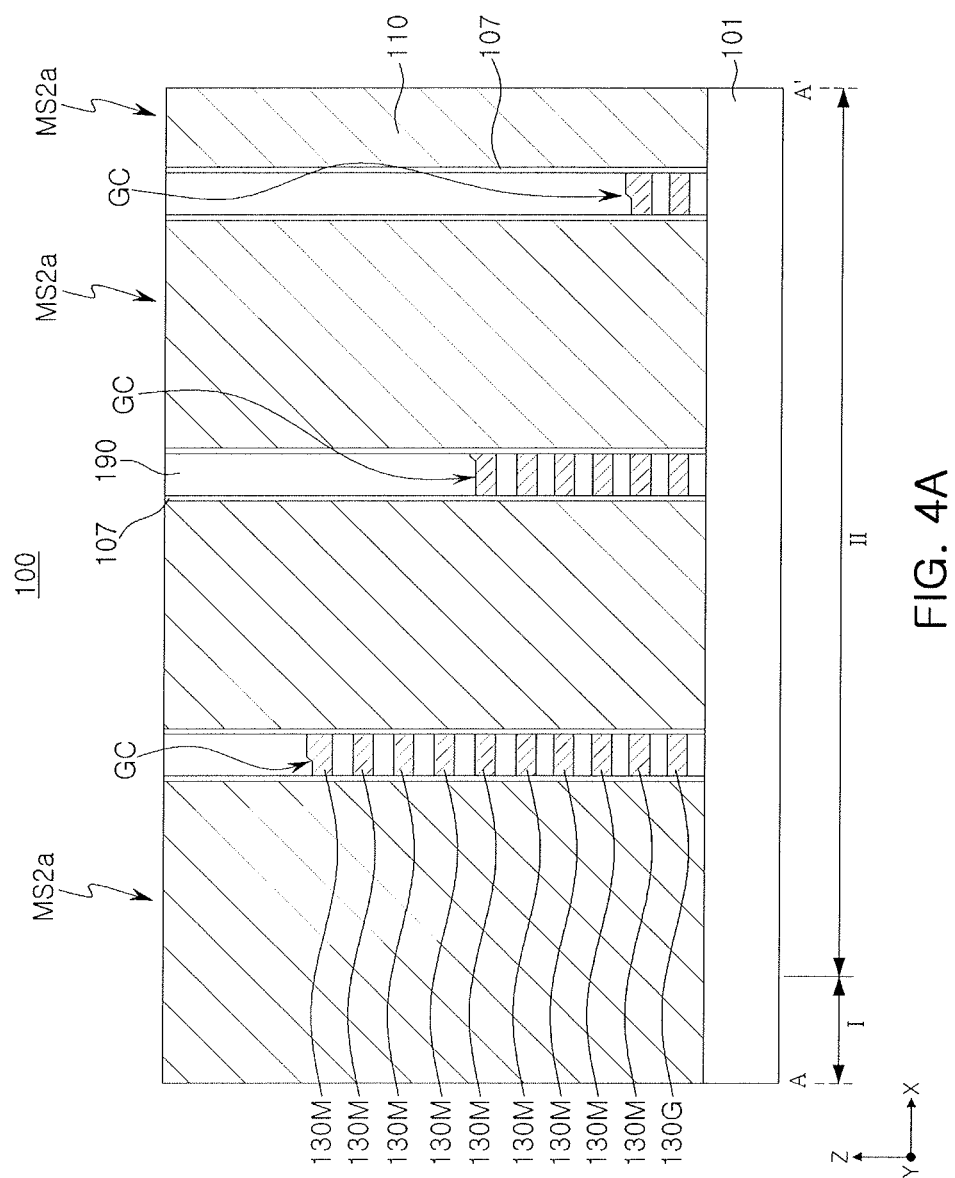
FIGS. 4A to 4C illustrate schematic cross-sectional views of a semiconductor device according to example embodiments.
Figure 4B:
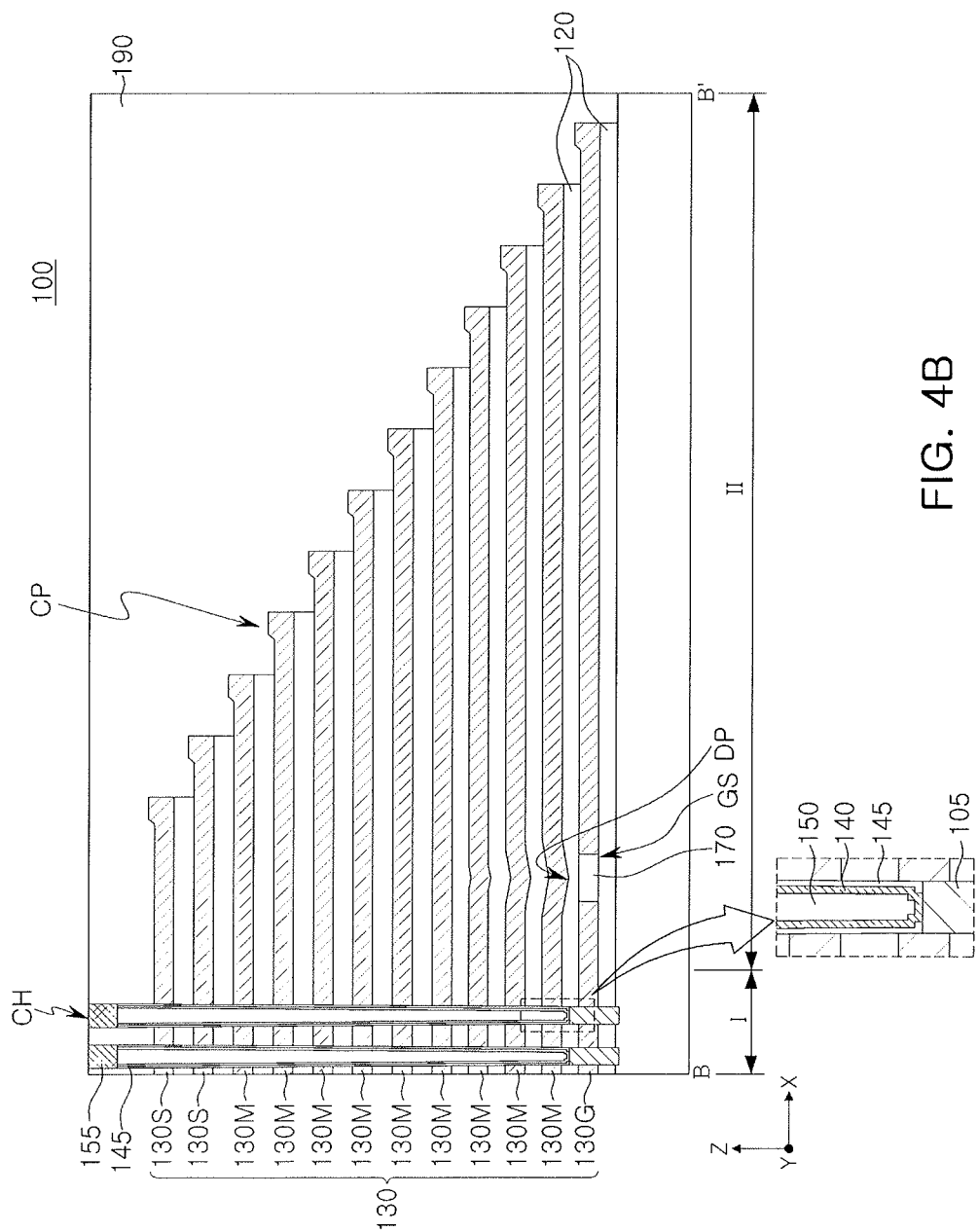
Figure 4C:
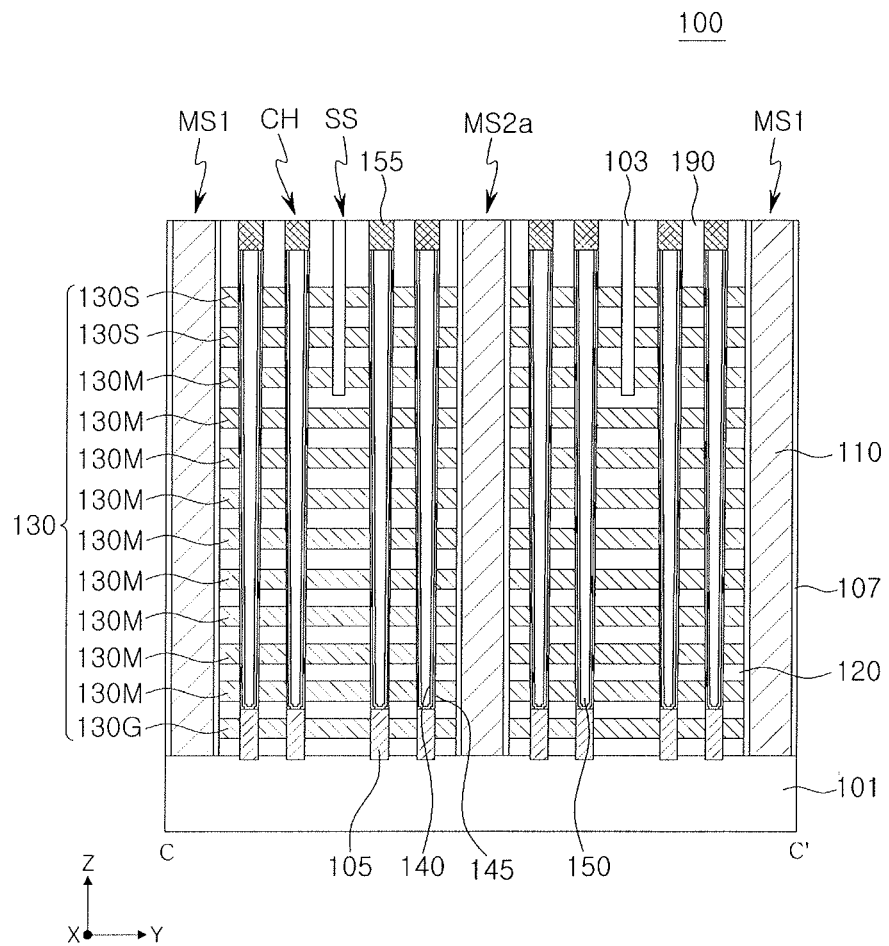

FIG. 3 is a schematic plan view of a semiconductor device 100 according to example embodiments. Referring to FIG. 3, the semiconductor device 100 corresponds to the semiconductor device 10 of FIG. 1, and only a main configuration of the semiconductor device 100 is illustrated for the sake of understanding. FIGS. 4A to 4C are schematic cross-sectional views along lines A-A', B-B', and C-C' in FIG. 3, respectively.

Referring to FIGS. 3 to 4C, a semiconductor device 100 may include a substrate 101 having a first region I and a second region II, gate electrodes 130 stacked on the substrate 101, channels CH arranged to pass through the gate electrodes 130, first and second separation regions MS1, MS2a and MS2b passing through the gate electrodes 130, upper separation regions SS passing through a portion of the gate electrodes 130, and insulation regions GS passing through at least one of the gate electrodes 130. The semiconductor device 100 may further include interlayer insulation layers 120 stacked alternately with the gate electrodes 130 on the substrate 101, gate dielectric layers 145, channel regions 140 in the channels CH, channel pads 155, channel insulation layers 150, and peripheral region insulation layers 190.

The first region I of the substrate 101 may be a region in which the gate electrodes 130 are vertically stacked and the channels CH are arranged, and may be a region corresponding to the memory cell array 20 of FIG. 1. The second region II may be a region in which the gate electrodes 130 extend by different lengths, and may correspond to a region electrically connecting the memory cell array 20 and the peripheral circuit 30 of FIG. 1. The second region II may be disposed at least at one end of the first region I in at least one direction, e.g., in an x direction, e.g., the first and second regions I and II may be adjacent to each other along the x direction.

The substrate 101 may have an upper surface extending in the x direction and a y direction. The substrate 101 may include a semiconductor material, e.g., a Group IV semiconductor, a Group III-V compound semiconductor, or a Group II-VI oxide semiconductor. For example, the Group IV semiconductor may include silicon, germanium or silicon-germanium. The substrate 101 may be provided as a bulk wafer or as an epitaxial layer.

The gate electrodes 130 may be vertically stacked on the first region I, e.g., may be stacked on top of each other along the z direction, and may extend by different lengths, e.g., in the x direction, from the first region I to the second region II. The gate electrodes 130 may include a lower gate electrode 130G forming a gate of the ground selection transistor GST of FIG. 2, memory gate electrodes 130M forming the plurality of memory cells MC, and upper gate electrodes 130S forming gates of the string selection transistors SST1 and SST2. The number of the memory gate electrodes 130M constituting the memory cells MC may be determined depending on a capacity of the semiconductor device 100. According to an embodiment, the upper and lower gate electrodes 130S and 130G of the string selection transistors SST1 and SST2 and the ground selection transistor GST may be present as one, or two or more, respectively, and may have the same or different structure as the memory gate electrodes 130M. A portion of the gate electrodes 130, e.g., the memory gate electrodes 130M adjacent to the upper or lower gate electrodes 130S or 130G may be dummy gate electrodes.

As illustrated in FIG. 3, the gate electrodes 130 may be arranged to be spaced apart from each other in the y direction by the first separation region MS1 extending in the x direction (reference numerals 130S, 130M, and 130G in FIG. 3 refer to exposed surfaces in a plan view of corresponding gate electrodes). The gate electrodes 130 between a pair of the first separation regions MS1 may form one memory block, but the scope of the memory block is not limited thereto. A portion of the gate electrodes 130, e.g., each of the memory gate electrodes 130M, may form one layer in one memory block. Specifically, the memory gate electrodes 130M may be connected by a gate connection region GC between the second separation regions MS2a and MS2b, arranged to be spaced apart from each other in the x direction. The gate connection region GC may refer to a region in which each of the gate electrodes 130 is horizontally connected on the same level between the second separation regions MS2a and MS2b. The upper and lower gate electrodes 130S and 130G may also be connected by a gate connection region GC between a portion of the second separation regions MS2a and MS2b, or may not form one layer, and may include a plurality of sub-gate electrodes. This will be described in more detail below with reference to FIG. 5.

Referring to FIG. 4B, the gate electrodes 130 in the second region II of the substrate 101 may extend by different lengths in the x direction to provide contact regions CP having stepped portions. In the contact regions CP, the gate electrodes 130 may be connected to contact plugs, whereby the gate electrodes 130 may be connected to an upper wiring structure. In the contact regions CP, the gate electrodes 130 may have an increased thickness to be stably connected to the contact plugs.

The gate electrodes 130 may include a metallic material, e.g., tungsten (W). According to an embodiment, the gate electrodes 130 may include polycrystalline silicon or a metal silicide material. The gate electrodes 130 may further include a diffusion barrier layer, e.g., tungsten nitride (WN), tantalum nitride (TaN), titanium nitride (TiN), or a combination thereof.

The interlayer insulation layers 120 may be arranged between the gate electrodes 130. The interlayer insulation layers 120 may be arranged to be spaced apart from each other in a direction perpendicular to the upper surface of the substrate 101, e.g., along the z direction, and to extend in the x direction, similar to those of the gate electrodes 130. The interlayer insulation layers 120 may include an insulating material, e.g., silicon oxide or silicon nitride.

The first and second separation regions MS1, MS2a and MS2b may be arranged to extend in the x direction in the first region I and the second region II. The first and second separation regions MS1, MS2a, MS2b may be arranged parallel to each other. The first separation regions MS1 and the second separation regions MS2a and MS2b may be arranged in a predetermined pattern in the y direction, and the second separation regions MS2a and MS2b may be arranged to be spaced apart from each other in a straight line in the x direction, respectively, e.g., multiple second separation regions MS2a may be arranged to be spaced apart from each other in a straight line in the x direction. The first and second separation regions MS1, MS2a and MS2b may pass through the entire gate electrodes 130 stacked on the substrate 101, e.g., along the z direction, to connect to the substrate 101.

The second separation regions MS2a and MS2b may include second central separation regions MS2a arranged in the middle of the pair of first separation regions MS1, e.g., in a center between two first separation regions MS1, and second auxiliary separation regions MS2b arranged between the first separation regions MS1 and the second central separation regions MS2a, e.g., between the second central separation regions MS2a in the center between the two first separation regions MS1 and each one of the two first separation regions MS1. The second central separation regions MS2a may be arranged over the first region I and the second region II, and the second auxiliary separation regions MS2b may be arranged only over the second region II. The second central separation regions MS2a may be arranged to extend in a single, e.g., continuous, form in the first region I, and may be arranged in plural, e.g., as multiple and discrete portions, to be separated from each other by a predetermined distance in a straight line in the second region II. The second auxiliary separation regions MS2b may be arranged in plural to be separated from each other by a predetermined interval on a straight line. However, the arrangement order and the number of the first and second separation regions MS1, MS2a and MS2b are not limited to those illustrated in FIG. 3. For example, in example embodiments, the second separation regions MS2a and MS2b may be arranged in four or more rows between the first separation regions MS1 in the y direction.

The first separation regions MS1 may include the common source line CSL described with reference to FIG. 2. The second separation regions MS2a and MS2b may include a dummy common source line. As illustrated in FIGS. 4A and 4C, the first and second separation regions MS1, MS2a and MS2b may include a source insulation layer 107, and a source conductive layer 110 electrically insulated from the gate electrodes 130 by the source insulation layer 107. The source conductive layer 110 of the first separation regions MS1 may correspond to the common source line CSL. The source conductive layer 110 of the second separation regions MS2a and MS2b may correspond to the dummy common source line. The source conductive layer 110 constituting the second separation regions MS2a and MS2b may be in a floating state, not connected to elements driving the semiconductor device 100, or in which an electrical signal is not applied, in a different manner to the source conductive layer 110 in the first separation regions MS1 corresponding to the common source line CSL.

The upper separation regions SS may extend in the x direction between the first separation regions MS1 and the second central separation region MS2a. The upper separation regions SS may be arranged side-by-side with the second auxiliary separation region MS2b, e.g., may be aligned along a same line in the x direction (FIG. 3). The upper separation regions SS may be formed in the first region I and in, e.g., only, a portion of the second region II to pass through, e.g., only, a portion of the gate electrodes 130, e.g., in the z direction, including the upper gate electrodes 130S among the gate electrodes 130. The upper gate electrodes 130S separated by the upper separation regions SS may form the string selection lines SSL (see FIG. 2) different from each other.

The upper separation regions SS may include an upper insulation layer 103. As illustrated in FIG. 4C, the upper insulation layer 103 may separate a total of three of the gate electrodes 130 including the upper gate electrodes 130S from each other in the y direction. However, the number of the gate electrodes 130 separated by the upper insulation layer 103 may be variously changed in the embodiments.

As illustrated in FIG. 3, the insulation region GS may be arranged to extend, e.g., continuously, in the horizontal direction across the substrate 101, e.g., in the y direction (dashed lines in FIG. 3). As illustrated in FIG. 4B, the insulation region GS may be at the same level as the lower gate electrode 130G, the lowermost layer, forming the gate of the ground selection transistor GST (of FIG. 2). That is, as illustrated in FIG. 4B, the lower gate electrode 130G may be separated or divided into two layers in the x direction by the insulation regions GS, between the first separation region MS1 and the second central separation region MS2a adjacent to each other (FIG. 3). In particular, the insulation regions GS may be arranged between a portion of the second central separation region MS2a extending from the first region I and the first separation region MS1. Therefore, both side surfaces of the insulation regions GS in they direction may be in contact with the first separation region MS1 and the second separation region MS2a, respectively.

As illustrated in FIG. 3, the insulation regions GS may have a linear shape extending in the y direction between the first and second separation regions MS1 and MS2a. The insulation regions GS may be arranged on a planar surface in a superimposed manner with the upper separation region SS. According to the embodiments, the insulation regions GS may be arranged to separate two or more layers of the lower gate electrodes 130G rather than one layer. Further, the lower gate electrode 130G separated by the insulation regions GS may not necessarily be disposed as a lowermost of the gate electrodes 130, and may be variously changed, depending on an arrangement position of the ground selection transistor GST.

The insulation regions GS may be arranged in the second region II adjacent to the first region I, and may be disposed such that the insulation regions GS are disposed between the first region I and a gate connection region GC closest to the first region I, along the x direction. The insulation regions GS may be arranged between the first region I and a leftmost of the gate connection regions GC. That is, from the left side in the drawing, the first region I, the insulation regions GS, and the gate connection regions GC may be arranged in sequence. Thus, the insulation regions GS may be arranged on a plane to not overlap the gate connection region GC. According to embodiments, when the dummy channels are arranged at end portions of the first region I, the dummy channels may be arranged to pass through the insulation regions GS.

With this arrangement, the lower gate electrode 130G may be separated into two layers by the second central separation regions MS2a in the y direction, and may be kept separated by the insulation regions GS in the x direction, between the pair of the first separation regions MS1 of the first region I. That is, even though the lower gate electrode 130G may be connected to each other by the gate connection regions GC in a region close to an end portion of the second region II, the lower gate electrode 130G extending from the first region I may be separated therefrom by the insulation regions GS. This will be described in more detail below with reference to FIG. 5.

As illustrated in FIG. 4B, insulation regions GS may include the lower insulation layer 170. The lower insulation layer 170 may include, e.g., silicon oxide, and may be the same material as the interlayer insulation layer 120. At least a portion of the interlayer insulation layers 120 and the gate electrodes 130 may have a depressed portion DP facing a center of the insulation region GS, at an upper portion of the insulation region GS. The interlayer insulation layers 120 and the gate electrodes 130 may have or not have a depressed portion DP of which a degree of bending is relatively low, in a direction away from the insulation region GS. In example embodiments, the depressed portion DP may be not formed, and the interlayer insulation layer 120 on the insulation region GS may have a flat upper surface, depending on a process of forming the insulation region GS. For example, as illustrated in FIG. 4B, portions of the memory gate electrodes 130M and the interlayer insulation layer 120 above and overlapping the insulation region GS may be depressed toward the upper surface of the insulation region GS, e.g., a depression degree may be decreased as a distance from the insulation region GS increases.

In the present embodiment, since the insulation regions GS are arranged to be spaced apart from the gate connection regions GC, the number thereof may be minimized and the structure thereof may be simplified, as compared with a case of overlapping with the gate connection regions GC arranged on a straight line with the second central separation regions MS2a. In addition, a width of the depressed portion DP may be reduced, e.g., in the x direction, as compared with a case of overlapping with a portion of the gate connection regions GC. Further, since the depressed portion DP does not overlap with an end portion of the second central separation regions MS2a, defects, e.g., short-circuit defects, leakage current defects of the gate electrodes 130, and the like, that may occur due to the depressed portion DP, may be prevented or substantially minimized.

The channels CH may be arranged to be spaced apart from each other, e.g., in two directions forming a row and column system, on the first region I. The channels CH may be arranged to form a lattice pattern, or may be arranged in a zigzag pattern in one direction. The channels CH may have columnar shapes, and may have inclined side surfaces that become narrower toward the substrate 101 depending on an aspect ratio. In example embodiments, dummy channels may be further arranged at an end portion of the first region I adjacent to the second region II and at the second region II. The dummy channels may have the same or similar structure as the channels CH, but may not perform a substantial function in the semiconductor device 100. In example embodiments, the dummy channels may also be arranged on the gate connection region GC.

Referring to the enlarged view of FIG. 4B, a channel region 140 may be disposed in the channels CH. In the channels CH, the channel region 140 may be formed as an annular shape surrounding the channel insulation layer 150, but may have a columnar shape, such as a cylinder or a prism without the channel insulation layer 150. The channel region 140 may be connected to an epitaxial layer 105 at a lower portion. The channel region 140 may include a semiconductor material, e.g., polycrystalline silicon or single-crystalline silicon, and the semiconductor material may be an undoped material, or a material including p-type or n-type impurities. The channels CH arranged in a straight line in the y direction between the first or second separation regions MS1, MS2a or MS2b and the upper separation region SS may be connected to the bit lines BL0 to BL2 (see FIG. 2), which are different from each other, respectively, depending on an arrangement of the upper wiring structure connected to channel pads 155.

The channel pads 155 may be arranged on an upper portion of the channel region 140 in the channels CH. The channel pads 155 may be arranged to cover an upper surface of the channel insulation layer 150, and to electrically connect to the channel region 140. The channel pads 155 may include, e.g., doped polycrystalline silicon.

A gate dielectric layer 145 may be disposed between the gate electrodes 130 and the channel region 140. Although not specifically illustrated, the gate dielectric layer 145 may include a tunneling layer, an electric charge storage layer, and a blocking layer, which are stacked in sequence from the channel region 140. The tunneling layer may tunnel an electric charge to the electric charge storage layer, and may include, e.g., silicon oxide ($SiO_2$), silicon nitride ($Si_3N_4$), silicon oxynitride (SiON), or combinations thereof. The electric charge storage layer may be an electric charge trapping layer or a floating gate conductive layer. The blocking layer may include, e.g., silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The epitaxial layer 105 may be disposed on the substrate 101 at a lower end of the channels CH, and may be disposed on a side surface of at least one of the gate electrodes 130. The epitaxial layer 105 may be disposed in a recess region of the substrate 101. A height of an upper surface of the epitaxial layer 105 may be higher than a height of an upper surface of a lowermost gate electrode 130, may be lower than a height of a lower surface of a gate electrode 130, disposed on an upper portion of the lowermost gate electrode, but is not limited thereto. In example embodiments, the epitaxial layer 105 may be omitted, and in this case, the channel region 140 may be directly connected to the substrate 101.

Figure 5:
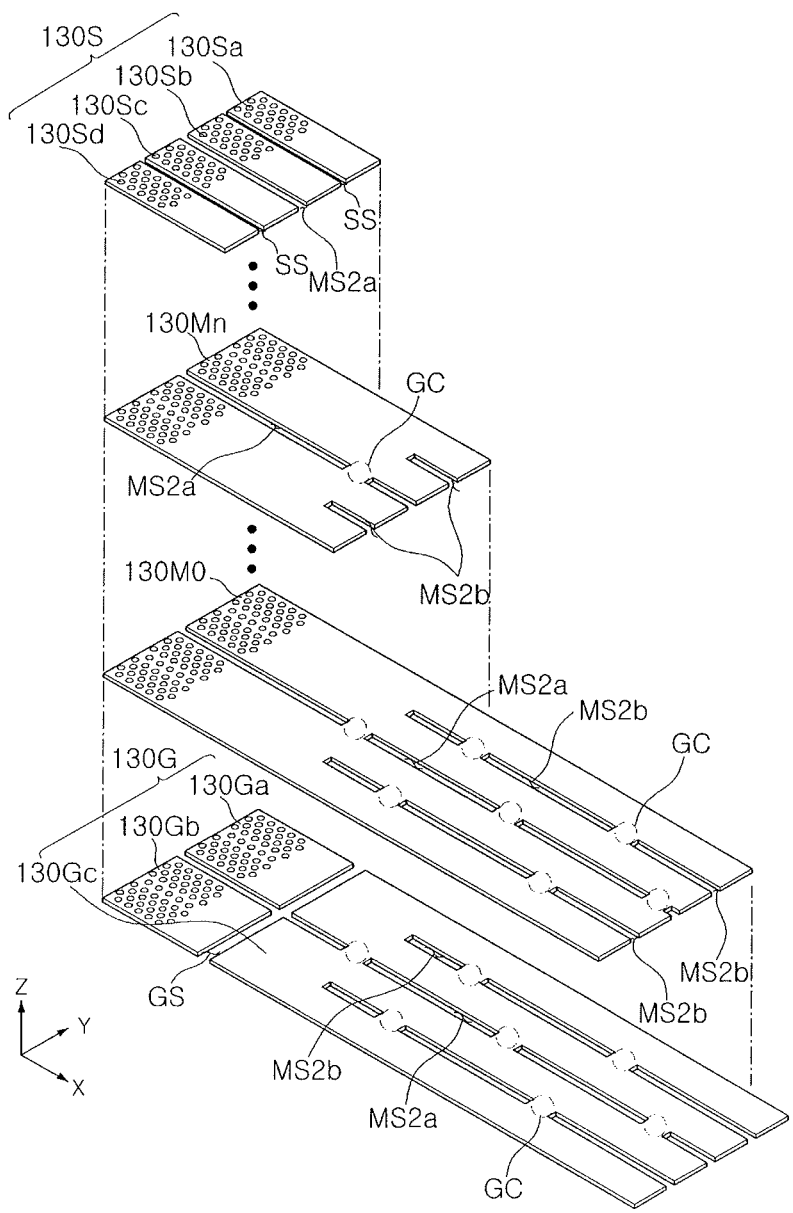
FIG. 5 illustrates an exploded perspective view of gate electrodes of a semiconductor device according to example embodiments.

FIG. 5 is an exploded perspective view illustrating the gate electrodes 130 of the semiconductor device 100 according to example embodiments. It is noted that FIG. 5 illustrates a portion of the gate electrodes 130 arranged between the pair of first separation regions MS1 of FIG. 3.

Referring to FIG. 5, the upper gate electrode 130S disposed as an uppermost gate electrode of the gate electrodes 130 may be used as a string selection line SSL. The upper gate electrode 130S may be separated into four sub-upper gate electrodes 130Sa, 130Sb, 130Sc, and 130Sd, respectively, in the y direction by the upper separation regions SS and the second central separation region MS2a. Each of the sub-upper gate electrodes 130Sa, 130Sb, 130Sc, and 130Sd may be connected to different contact plugs to independently receive an electrical signal. For example, two uppermost ones of the gate electrodes 130 may correspond to the upper gate electrode 130S, but the number of the upper gate electrodes 130S may vary in embodiments.

A memory gate electrode 130Mn disposed on a lower portion of the upper gate electrode 130S may have a shape partially separated by the second separation regions MS2a and MS2b as borders. The memory gate electrode 130Mn may have a shape connected as a single layer by the gate connection region GC between the second central separation regions MS2a (dashed circled in FIG. 5). A lowermost memory gate electrode 130M0 may also have regions through which the second separation regions MS2a and MS2b pass, but may have a shape connected as a single layer by the gate connection regions GC. In particular, the memory gate electrode 130M0 may have a shape connected as a single form by the gate connection regions GC between the second central separation regions MS2a. In FIG. 5, only the uppermost memory gate electrode 130Mn and the lowermost memory gate electrode 130M0 among the memory gate electrodes 130M are illustrated. However, the other memory gate electrodes 130M may be similarly arranged to form as a single layer, e.g., each of the memory gate electrodes 130M may be formed as a single layer.

The lower gate electrode 130G disposed on a lower portion of the memory gate electrodes 130M of the gate electrodes 130 may be used as the ground selection line GSL, and may be divided into three sub-lower gate electrodes 130Ga, 130Gb, and 130Gc by the insulation regions GS and the second central separation regions MS2a. The insulation regions GS may be arranged to be spaced apart from the gate connection regions GC. The insulation regions GS may be arranged inwardly toward the channels CH, e.g., between the channels CH and a terminal end of the second central separation region MS2a it intersects, along the x direction. The insulation regions GS may be arranged between the channels CH and the gate connection regions GC closest to the channels CH, along the x direction. Each of the two sub-lower gate electrodes 130Ga and 130Gb arranged on one side of the insulation region GS among the sub-lower gate electrodes 130Ga, 130Gb, and 130Gc may be connected to different contact plugs to independently receive an electrical signal. The sub-lower gate electrode 130Gc on the other side of the insulation region GS among the sub-lower gate electrodes 130Ga, 130Gb, and 130Gc may be a dummy sub-lower gate electrode that does not receive an electrical signal.

Figure 6A:
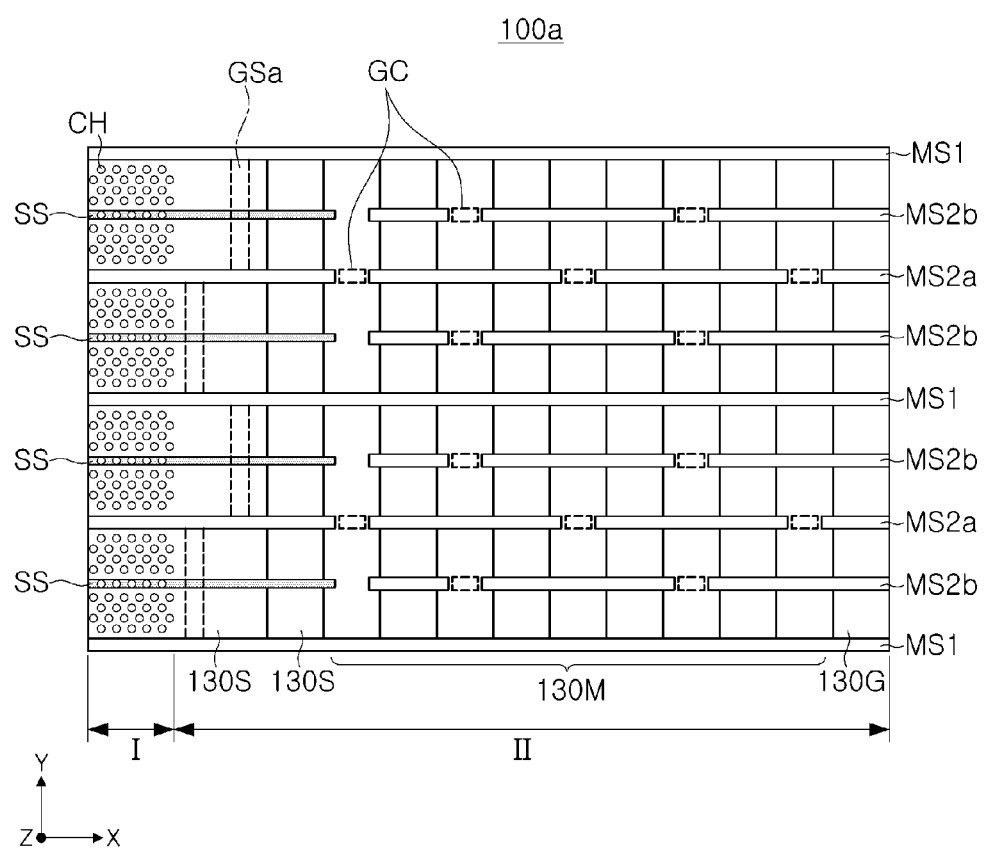
FIGS. 6A and 6B illustrate schematic plan views of a semiconductor device according to example embodiments.
Figure 6B:
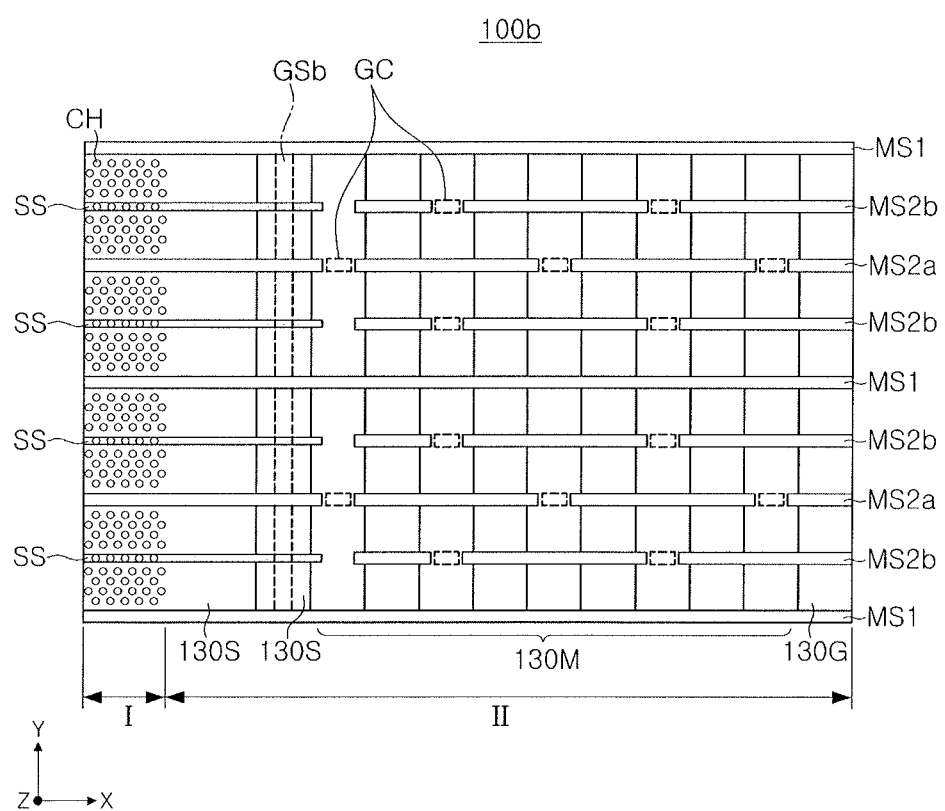

FIGS. 6A and 6B are schematic plan views of a semiconductor device according to example embodiments.

Referring to FIG. 6A, in a different manner relative to the embodiment of FIG. 3, insulation regions GSa may be arranged in a zigzag pattern in the y direction in a semiconductor device 100a, e.g., each of the insulation regions GSa may intersect only one upper separation region SS (viewed in a top view) and be offset in the x direction with respect to an adjacent insulation regions GSa in the y direction. Specifically, the insulation regions GSa may be alternately arranged at two or more different positions in the x direction between the first separation region MS1 and the second central separation region MS2a. In this case, the insulation regions GSa may be arranged in the second region II adjacent to the first region I, and may be disposed between the first region I and the gate connecting region GC closest to the first region I.

Referring to FIG. 6B, in a different manner relative to the embodiment of FIG. 3, insulation regions GSb may be arranged on a lower portion of a contact region CP (See FIG. 4B) in which the upper gate electrodes 130S extend by different lengths, in a semiconductor device 100b. For example, referring to FIGS. 4B and 6B, the insulation region GSb may extend along the y direction to overlap an exposed upper surface of a lower one of the two upper gate electrodes 130S, e.g., closer to the gate connection region GC compared to FIG. 3. The insulation regions GSb may be arranged even in a region in which the gate electrodes 130 form stepped portions in the second region II adjacent to the first region I. In this case, the insulation regions GSb may be arranged between the first region I and the gate connecting region GC closest to the first region I. That is, an arrangement of the insulation regions GSb may be variously changed within a range that may be arranged on the left side of the gate connection region GC as viewed in a plan view.

Figure 7:
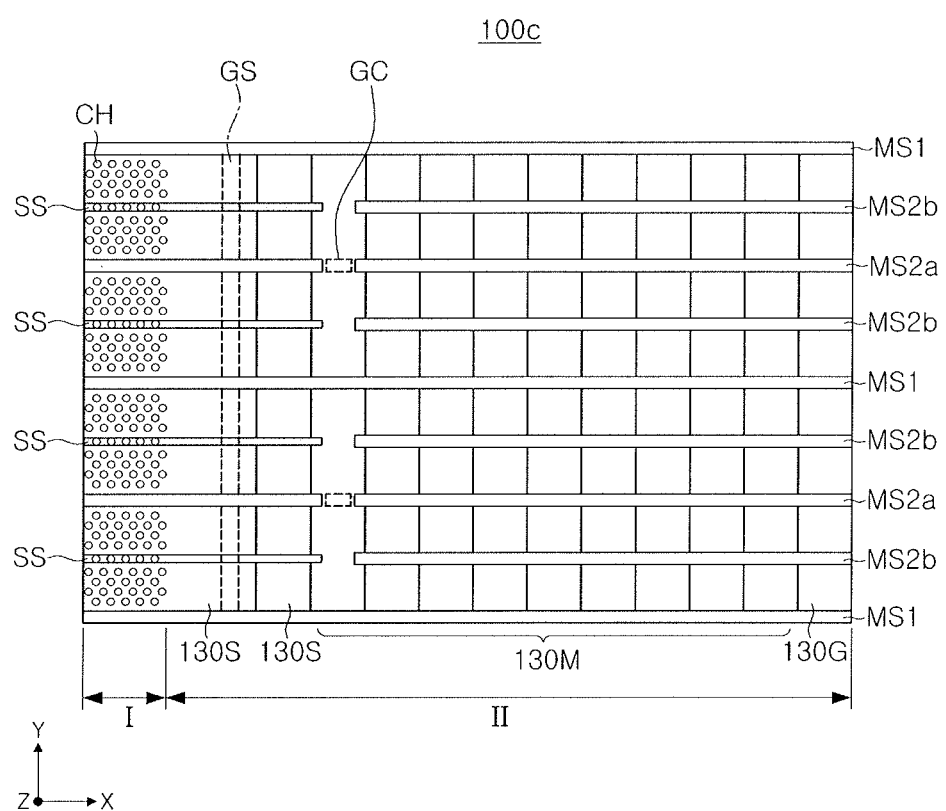
FIG. 7 illustrates a schematic plan view of a semiconductor device according to an example embodiment.

FIG. 7 is a schematic plan view of a semiconductor device according to an example embodiment.

Referring to FIG. 7, in a different manner relative to the embodiment of FIG. 3, second auxiliary separation regions MS2b may extend in one linear form in a second region II in a semiconductor device 100c. Also, portions of the second central separation regions MS2a may extend from the first region I to a portion of the second region II, and the other portions of the second central separation regions MS2a in the second region II may be separated from the second central separation regions MS2a extended from the first region I at predetermined intervals to extend as a single form. Therefore, the gate connection regions GC may be arranged in a straight line, e.g., all the gate connection regions GC may be aligned along the y direction while being spaced apart from each other along the y direction (viewed in a top view), and may be arranged only between the second central separation regions MS2a adjacent to each other, e.g., no gate connection regions GC may be aligned between adjacent portions of the second auxiliary separation regions MS2b in the x direction.

As described above, in the embodiments, an arrangement of the second separation regions MS2a and MS2b and an arrangement of the gate connection regions GC may be variously changed, and may be determined in consideration of a size of the second region II, the number of the gate electrodes 130, a height of a stacked structure of the gate electrodes 130, or the like.

Figure 8A:
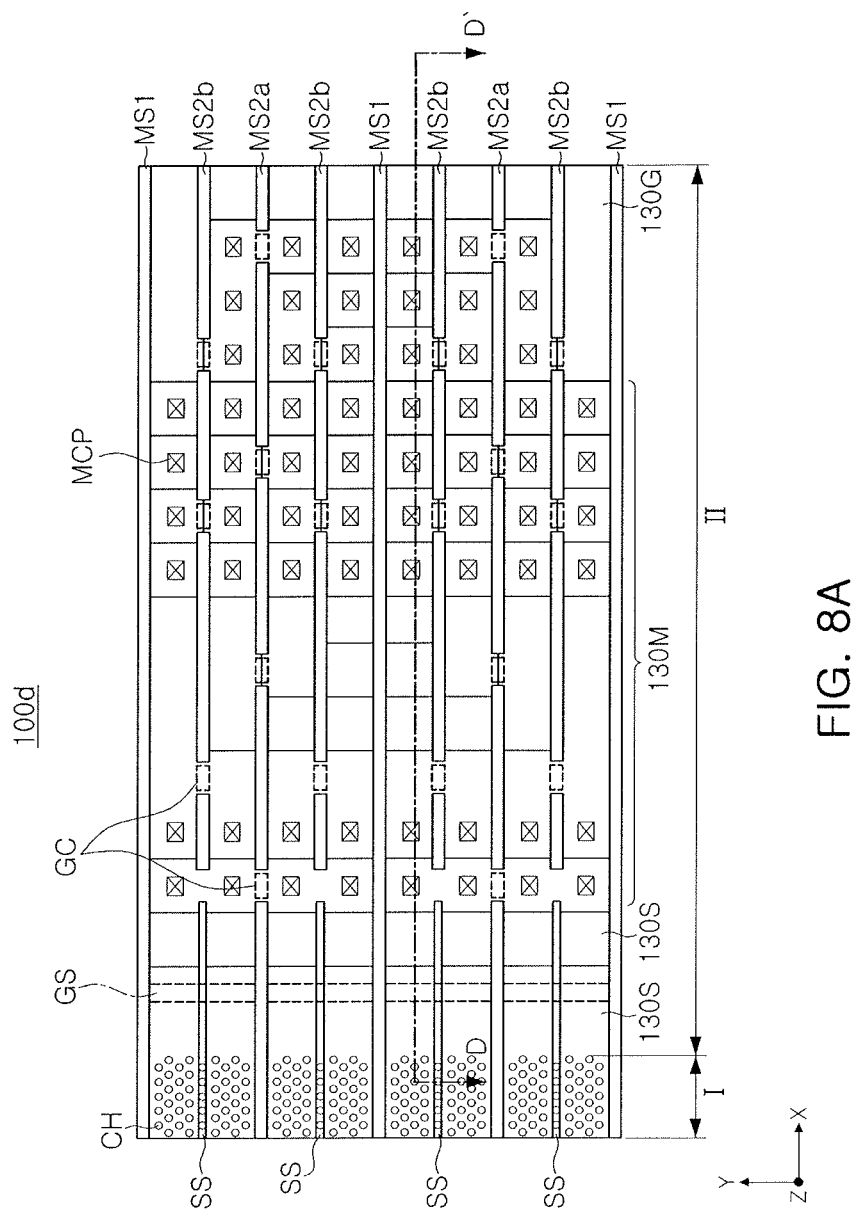
FIGS. 8A and 8B illustrate schematic plan and cross-sectional views of a semiconductor device according to example embodiments.
Figure 8B:
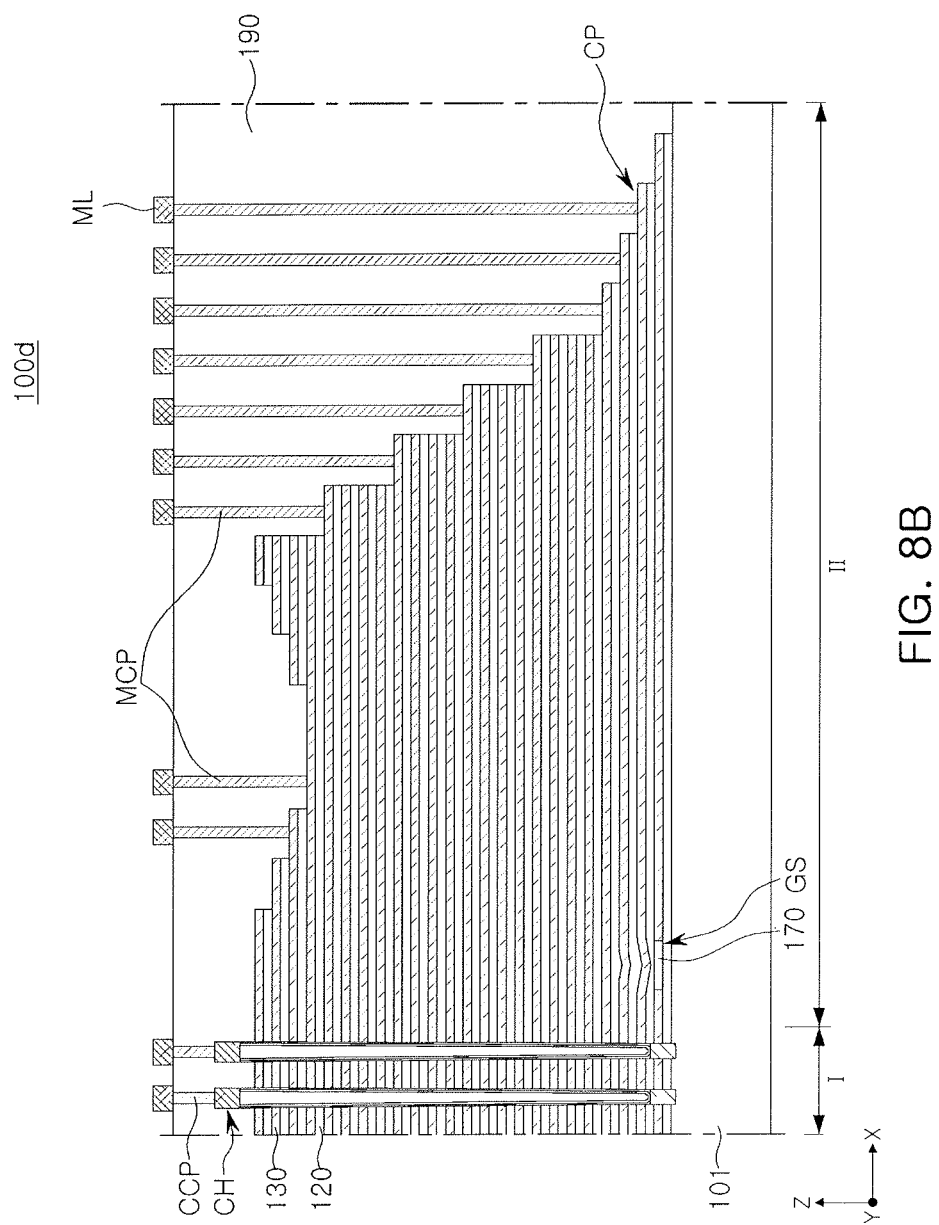

FIGS. 8A and 8B are schematic plan and cross-sectional views, respectively, of a semiconductor device according to an example embodiment.

Referring to FIGS. 8A and 8B, in a semiconductor device 100d, a portion of gate electrodes 130 may be arranged to have stepped portions in they direction as well as in the x direction to form respective contact regions CP. The semiconductor device 100d may further include contact plugs MCP arranged on stepped regions of the gate electrodes 130, i.e., the contact regions CP, and wiring layers ML connected to the contact plugs MCP.

First, in a different manner relative to the embodiment of FIG. 3, the gate electrodes 130 may be formed such that at least a portion of the memory gate electrodes 130M and the lower gate electrode 130G have stepped portions in the y direction as well as in the x direction to form the contact regions CP. In order to realize such a structure, except for the upper and lower gate electrodes 130S and 130G, at least a portion of the memory gate electrodes 130M may include, e.g., consist of, stacked structures, each including a certain number of the memory gate electrodes 130M, e.g., four electrodes, and may form stepped portions between the stacked structures. Four memory gate electrodes 130M forming the one stacked structure may be arranged to have stepped portions from each other in the y direction. Further, a dummy stacked structure in which the contact plugs MCP are not connected may be disposed on an uppermost stacked structure.

According to the arrangement of the contact regions CP, at least one of the contact plugs MCP formed on the gate electrode 130 connected as a single layer may be connected to an upper wiring layer ML. Although not illustrated, the upper gate electrodes 130S and the lower gate electrode 130G may be electrically connected to the contact plugs MCP and upper wiring layers ML in another second region II disposed on the other side of the first region I, e.g., the upper gate electrodes 130S and the lower gate electrode 130G may be electrically connected to the contact plugs MCP and upper wiring layers ML in a second region II disposed on left side the first region I (not illustrated in FIG. 8B). For example, in a case of the lower gate electrode 130G in FIG. 8B, the lower gate electrode 130G may not be connected to the contact plug MCP on the right side of the insulation region GS, i.e., on the right side of a region separated by the insulation region GS, and may be connected to a contact plug MCP on the left side of the first region I. According to the embodiments, a portion of the memory gate electrodes 130M may also be wired in the second region II on the other side, e.g., left of the first region I, or may be wired on both sides.

Since the memory gate electrodes 130M are connected as a single form by the gate connection region GC, one of the memory gate electrodes 130M may be entirely electrically connected to the upper wiring layer ML by at least one of the contact plugs MCP, even though the contact regions CP having stepped portion in the y direction are formed. Therefore, wiring structures connected to the memory gate electrodes 130M may be further simplified.

The contact plugs MCP and the wiring layers ML may be made of a conductive material. Channel contact plugs CCP connected to channels CH may also be made of a conductive material.

Figure 9:
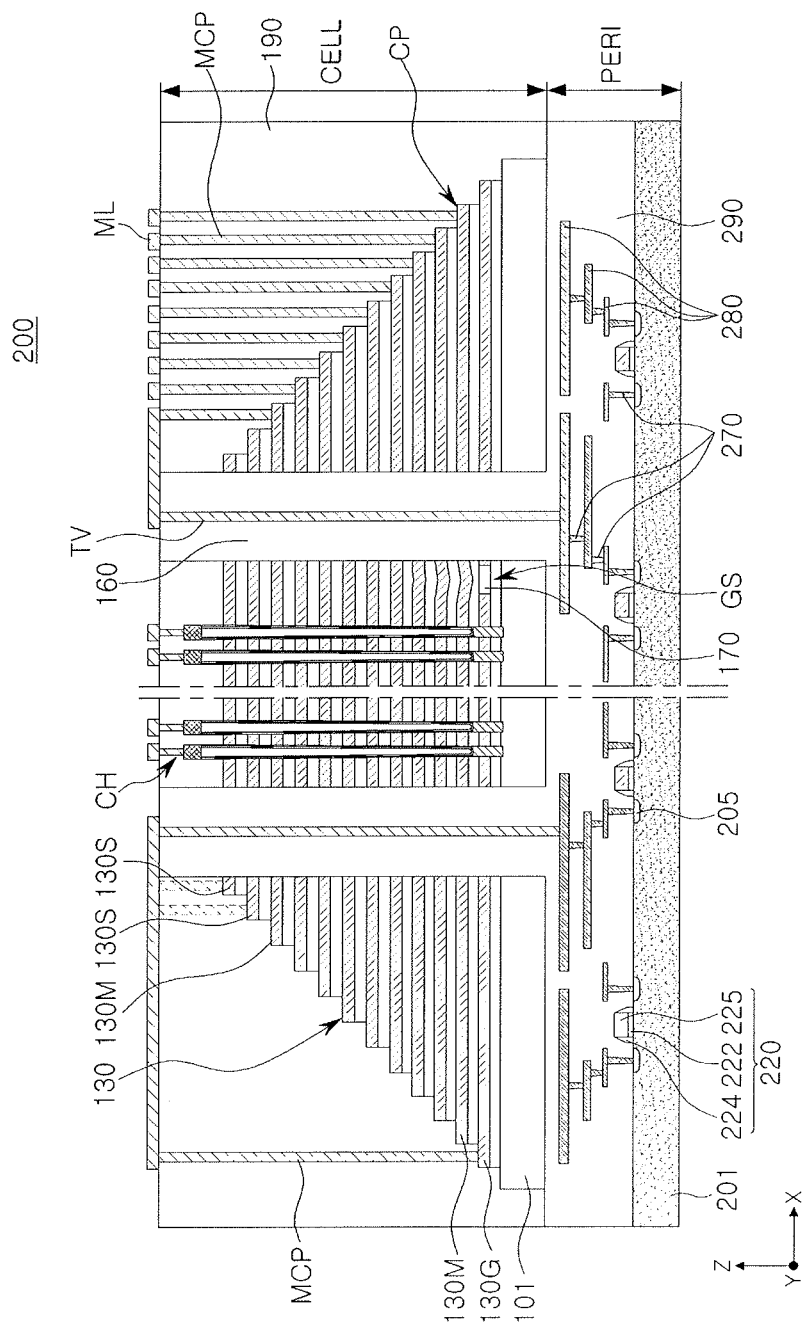
FIG. 9 illustrates a schematic cross-sectional view of a semiconductor device according to example embodiments.

FIG. 9 is a schematic cross-sectional view of a semiconductor device according to an example embodiment.

Referring to FIG. 9, a semiconductor device 200 may include a memory cell region CELL and a peripheral circuit region PERI. The memory cell region CELL may be disposed at an upper end of the peripheral circuit region PERI. In example embodiments, the memory cell region CELL may be disposed at a lower end of the peripheral circuit region PERI.

The memory cell region CELL may include the substrate 101, the gate electrodes 130 stacked on the substrate 101, the channels CH disposed to pass through the gate electrodes 130, and the insulation regions GS passing through the lower gate electrode 130G, as described above with reference to FIGS. 3 to 4C. The memory cell region CELL may have structures according to various embodiments, as described above with reference to FIGS. 6A to 8B. Particularly, the memory cell region CELL may further include a through wiring region 160 passing through the substrate 101 to connect to the peripheral circuit region PERI.

The peripheral circuit region PERI may include a base substrate 201, and circuit elements 220, circuit contact plugs 270, and wiring lines 280 arranged on the base substrate 201. For example, as illustrated in FIG. 9, the substrate 101 of the memory cell region CELL may be on the wiring lines 280 of the peripheral circuit region PERI.

The base substrate 201 may have an upper surface extending in the x direction and in the y direction. An active region may be defined by forming separate isolation layers in the base substrate 201. Source/drain regions 205 containing impurities may be arranged in a portion of the active region. The base substrate 201 may include a semiconductor material, e.g., a Group IV semiconductor, a Group III-V compound semiconductor, or a Group II-VI oxide semiconductor.

The circuit elements 220 may include a planar transistor. Each of the circuit elements 220 may include a circuit gate insulation layer 222, a spacer layer 224, and a circuit gate electrode 225. The source/drain regions 205 may be arranged on both sides of the circuit gate electrode 225 in the base substrate 201.

A peripheral region insulation layer 290 may be disposed on the circuit element 220 on the base substrate 201. The circuit contact plugs 270 may be connected to the source/drain regions 205 through the peripheral region insulation layer 290. An electrical signal may be applied to the circuit element 220 by the circuit contact plugs 270. In a region not illustrated, the circuit contact plugs 270 may also be connected to the circuit gate electrode 225. The wiring lines 280 may be connected to the circuit contact plugs 270, and may be arranged in a plurality of layers.

The semiconductor device 200 may be manufactured by forming the peripheral circuit region PERI, forming the substrate 101 of the memory cell region CELL on the peripheral circuit region PERI, and forming the memory cell region CELL. The substrate 101 may have the same size as the base substrate 201, or may be formed smaller than the base substrate 201.

As illustrated in FIG. 9, the gate electrodes 130 of the memory cell region CELL may be electrically connected to the circuit elements 220 of the peripheral circuit region PERI via the wiring layer ML and the contact plug MCP. A through via TV may connect the wiring layers ML of the memory cell region CELL and the wiring lines 280 of the peripheral circuit region PERI through the through wiring region 160. For example, the wiring lines 280 connected to the memory gate electrodes 130M in the contact regions CP at a first side of the channels CH, e.g., right side of the channels CH in FIG. 9, may be electrically connected to the peripheral circuit region PERI through a first through via TV. In the contact regions CP at a second side of the channels CH, e.g., left side of the channels CH in FIG. 9, the wiring lines 280 connected to upper and lower gate electrodes 130S and 130G may be electrically connected to the peripheral circuit region PERI through a second through via TV. In this case, as illustrated in FIG. 9, the lower gate electrode 130G may be connected to the contact plug MCP in the contact region CP in a direction in which the insulation region GS is not disposed, i.e., the insulation region GS and the connection between the lower gate electrode 130G and contact plug MCP may be at opposite side of the channels CH. In the embodiments, a wiring structure in the contact regions CP at both ends of the memory cell region CELL may be variously changed.

FIGS. 10A to 15B are schematic plan and cross-sectional views of stages in a method of manufacturing a semiconductor device according to example embodiments. Cross-sectional views in FIGS. 10A to 15B illustrate regions corresponding to FIG. 4B or FIG. 4C.

Figure 10A:
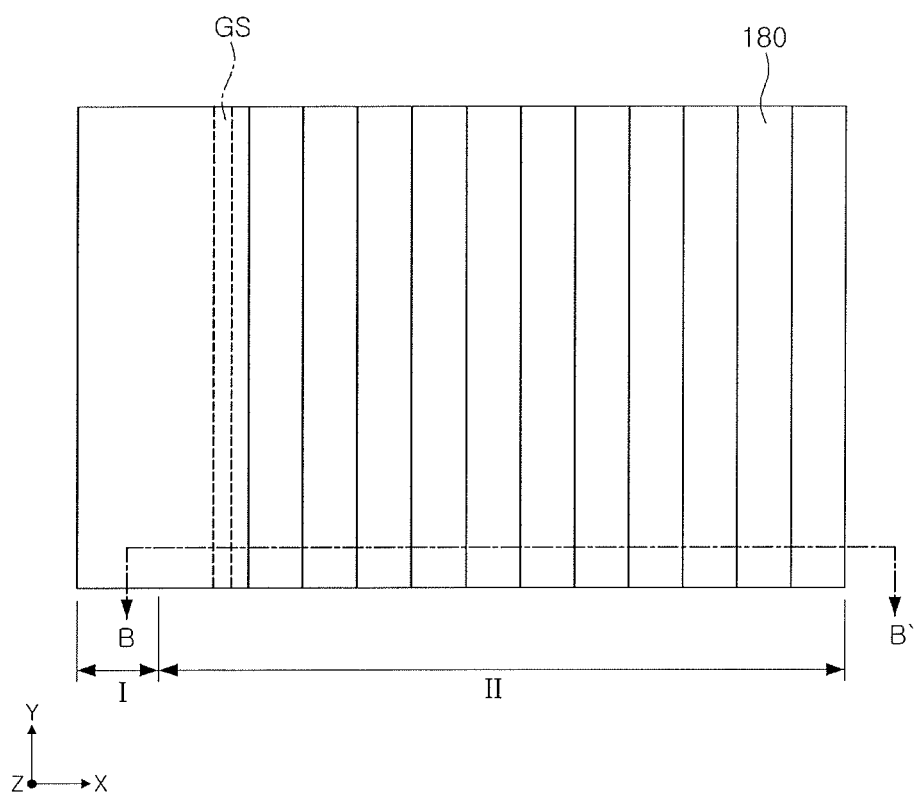
FIGS. 10A to 15B illustrate schematic plan and cross-sectional views of stages in a method of manufacturing a semiconductor device according to example embodiments.
Figure 10B:
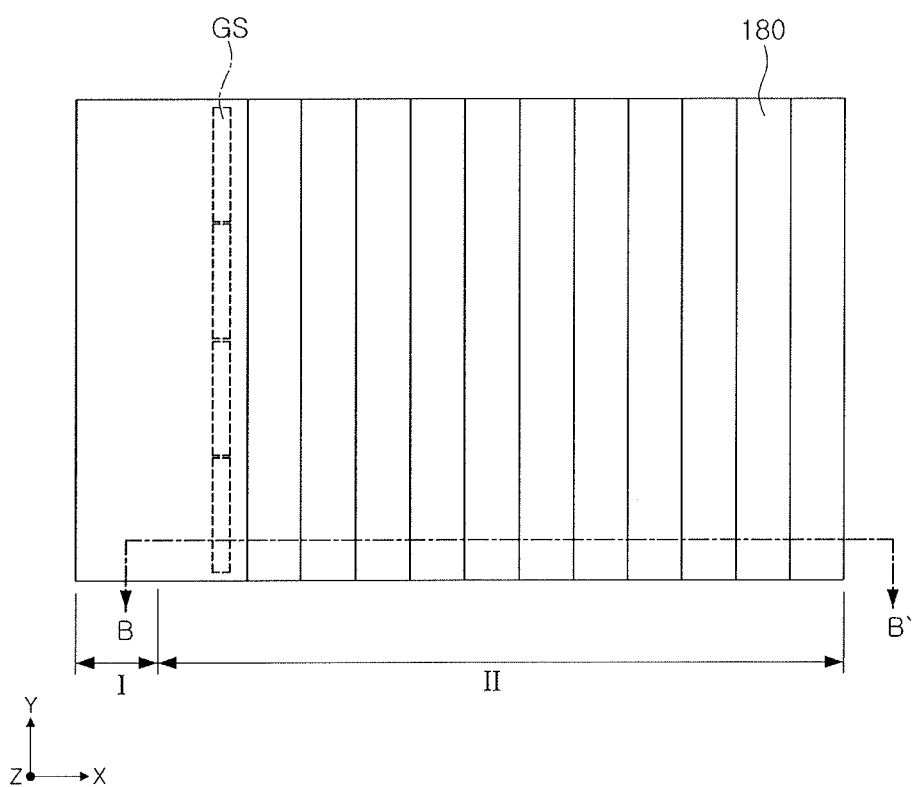
Figure 10C:
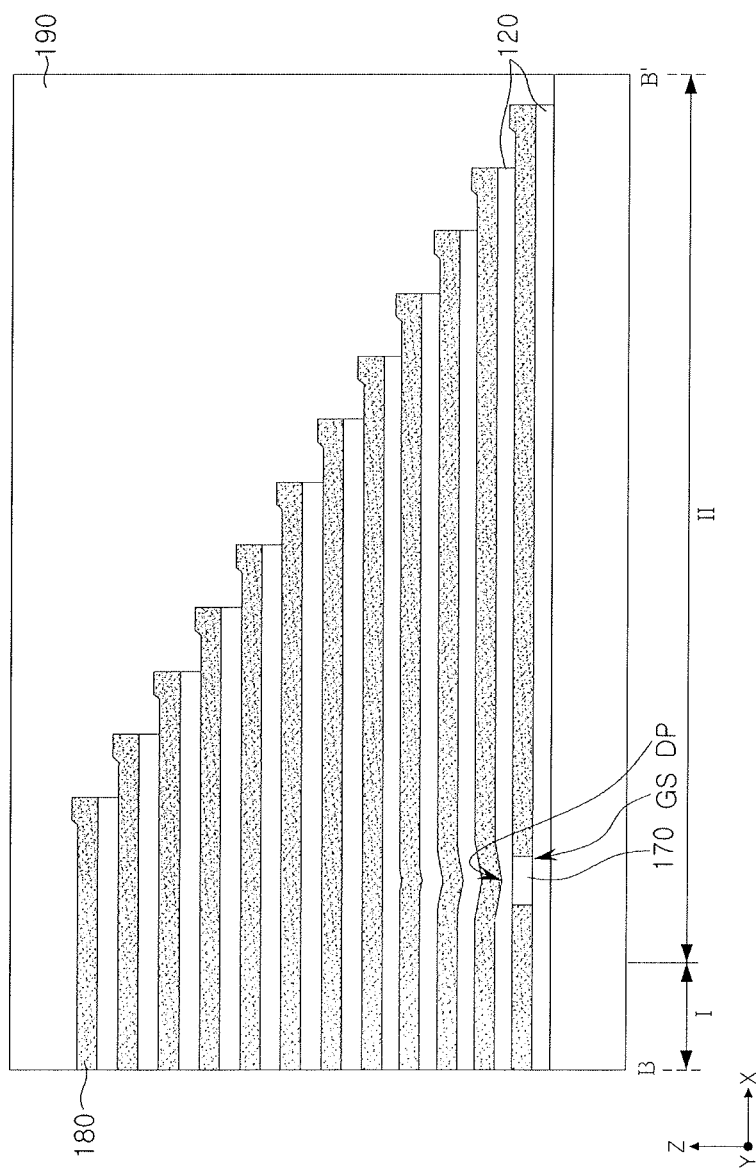

Referring to FIGS. 10A to 10C, the insulation region GS, sacrificial layers 180, and the interlayer insulation layers 120 may be alternately stacked on the substrate 101. The sacrificial layers 180 and a portion of the interlayer insulation layers 120 may be removed to extend the sacrificial layers 180 by different lengths in the x direction.

After forming a lowermost end of the sacrificial layer 180, a patterning process and a process of depositing an insulating material may be performed to form the insulation region GS including the lower insulation layer 170, as illustrated in FIG. 10C. The insulation regions GS may be patterned in a linear, e.g., continuous, form extending in the y direction, as illustrated in FIG. 10A, or may be patterned in forms of rectangles spaced apart from each other in the y direction, as illustrated in FIG. 10B. In this case, the rectangles may include a region between a first separation region MS1 and a second separation region MS2a of FIG. 3.

The lower insulation layer 170 may be formed of a material having etch selectivity with respect to the sacrificial layers 180. In example embodiments, the insulation region GS may be formed as a portion of the interlayer insulation layer 120 material by removing the sacrificial layer 180 in the region and then forming the interlayer insulation layer 120 thereon. For example, a portion of the lowermost sacrificial layer 180 may be removed, e.g., by patterning, and the interlayer insulation layer 120 may be formed on the lowermost sacrificial layer 180 to cover the upper surface of the lowermost sacrificial layer 180 and to replace the removed portion of the lowermost sacrificial layer 180. In example embodiments, the insulation region GS may be formed as a portion of the material of the interlayer insulation layer 120 formed to replace the removed portion of the lowermost sacrificial layer 180, i.e., by removing the sacrificial layer 180 in the region and then forming the interlayer insulation layer 120 thereon. In this case, when an upper interlayer insulation layer 120 is not separately subjected to a planarization process, the upper interlayer insulation layer 120 may have the depressed portion DP, as illustrated in FIG. 10C. When a planarization process is separately performed on the upper interlayer insulation layer 120, the depressed portion DP may not be formed.

The sacrificial layers 180 may be a layer to be replaced with the gate electrodes 130 through a subsequent process. The sacrificial layers 180 may be formed of a material that may be etched with etch selectivity with respect to the interlayer insulation layers 120. For example, the interlayer insulation layer 120 may be made of at least one of silicon oxide and silicon nitride. The sacrificial layers 180 may be made of other materials different from those of an interlayer insulation layer 120, e.g., silicon, silicon oxide, silicon carbide, and silicon nitride. In the embodiments, thicknesses of the interlayer insulation layers 120 may not be all identical. For example, a lowermost one of the interlayer insulation layers 120 may be formed to be relatively thin. An uppermost one of the interlayer insulation layers 120 may be formed to be relatively thick. The thicknesses of the interlayer insulation layers 120 and the sacrificial layers 180 and the number of layers constituting them may be variously changed from those illustrated in the drawings.

A photolithography process and an etching process with respect to the sacrificial layers 180 may be repeatedly performed such that an upper portion of the sacrificial layers 180 in the second region II extend shorter than a lower portion of the sacrificial layers 180. Thereby, the sacrificial layers 180 may be formed into a stepped shape. Next, regions to be exposed in which the sacrificial layers 180 extend longer than an upper portion of the sacrificial layers 180 may be further deposited with a material to be formed of the sacrificial layers 180. Thereby, end portions of the sacrificial layers 180 may be formed to have a relatively thick thickness. Next, a peripheral region insulation layer 190 may be formed to cover an upper portion of stacked structures of the sacrificial layers 180 and the interlayer insulation layers 120.

Figure 11A:
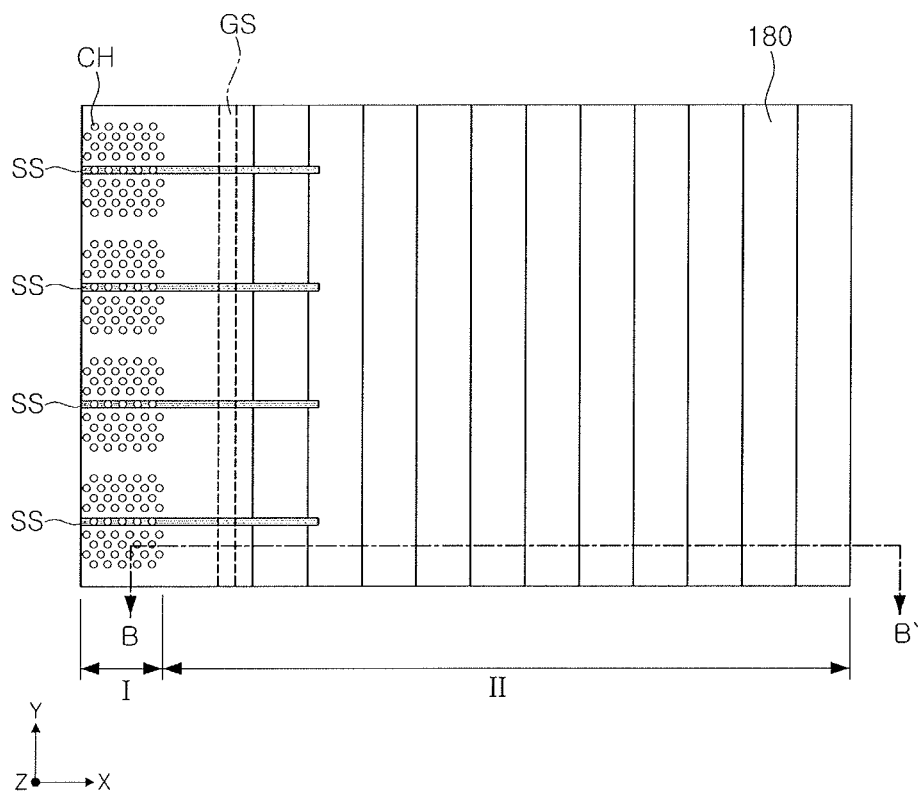
Figure 11B:
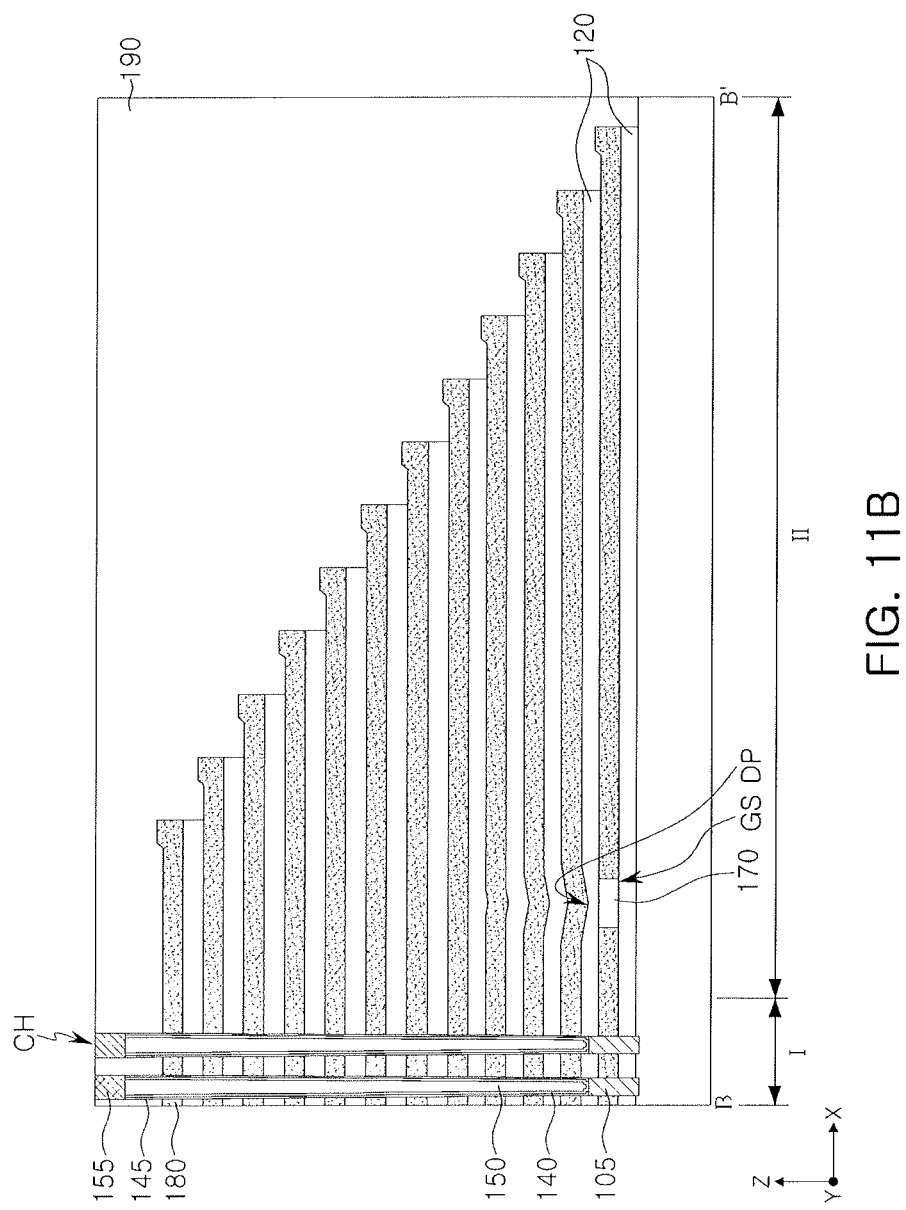

Referring to FIGS. 11A and 11B, portions of sacrificial layers 180 and interlayer insulation layers 120 may be removed to form the upper separation region SS. The channel CH may be formed to pass through the stacked structures of the sacrificial layers 180 and the interlayer insulation layers 120.

The upper separation region SS may extend in the x direction, and may extend from the first region I to a portion of the second region II. A separate mask layer may be used to expose a region in which the upper separation region SS is formed, and a predetermined number of sacrificial layers 180 and interlayer insulation layers 120 may be removed from an uppermost portion. The upper separation region SS may extend downwardly than a region in which an upper portion of the upper gate electrodes 130S of FIG. 3 is formed. An insulating material may be deposited on a region in which the sacrificial layers 180 and the interlayer insulation layers 120 are removed, to form an upper insulation layer 103 (see FIG. 4C). For example, the upper insulation layer 103 may be made of a material having etch selectivity with respect to the sacrificial layers 180, and may be made of the same material as the interlayer insulation layer 120.

The channels CH may be formed by anisotropically etching the sacrificial layers 180 and the interlayer insulation layers 120, and may be formed in a hole shape. Due to a height of the stacked structure, side walls of the channels CH may not be perpendicular to an upper surface of the substrate 101. In example embodiments, the channels CH may be formed to recess a portion of the substrate 101. Next, the epitaxial layer 105, at least a portion of the gate dielectric layer 145, the channel region 140, the channel isolation layer 150, and the channel pads 155 may be formed in the channels CH. Dummy channels to be arranged in addition to the channels CH may also be formed together with the channels CH in this operation.

The epitaxial layer 105 may be formed using a selective epitaxial growth (SEG). The epitaxial layer 105 may be formed in a single layer or a plurality of layers. The epitaxial layer 105 may include, e.g., polycrystalline silicon, single-crystalline silicon, polycrystalline germanium, or single-crystalline germanium, in which impurities are doped or undoped.

The gate dielectric layer 145 may be formed to have a uniform thickness using an atomic layer deposition (ALD) or a chemical vapor deposition (CVD). In this operation, all or a portion of the gate dielectric layer 145 may be formed, and a portion extending perpendicularly to the substrate 101 along the channels CH may be formed in this operation. The channel region 140 may be formed on the gate dielectric layer 145 in the channels CH. The channel insulation layer 150 may be formed to fill the channels CH, and may be formed of an insulating material. According to the embodiments, a conductive material may fill inside space of the channel regions 140, not the channel insulation layer 150. The channel pad 155 may be made of a conductive material, e.g., polycrystalline silicon.

Figure 12A:
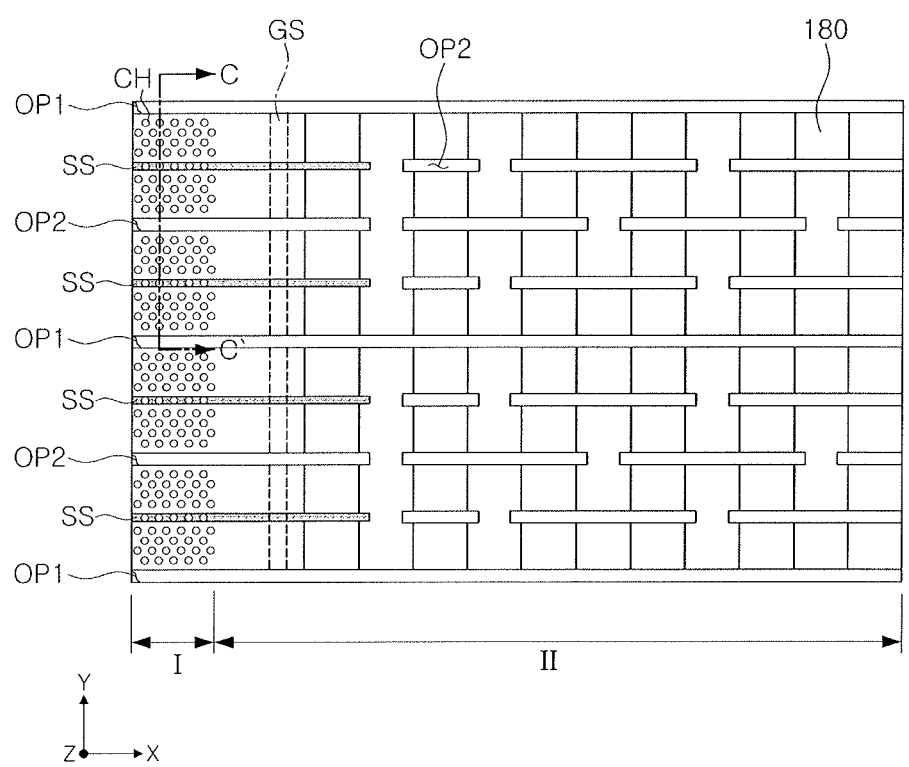
Figure 12B:
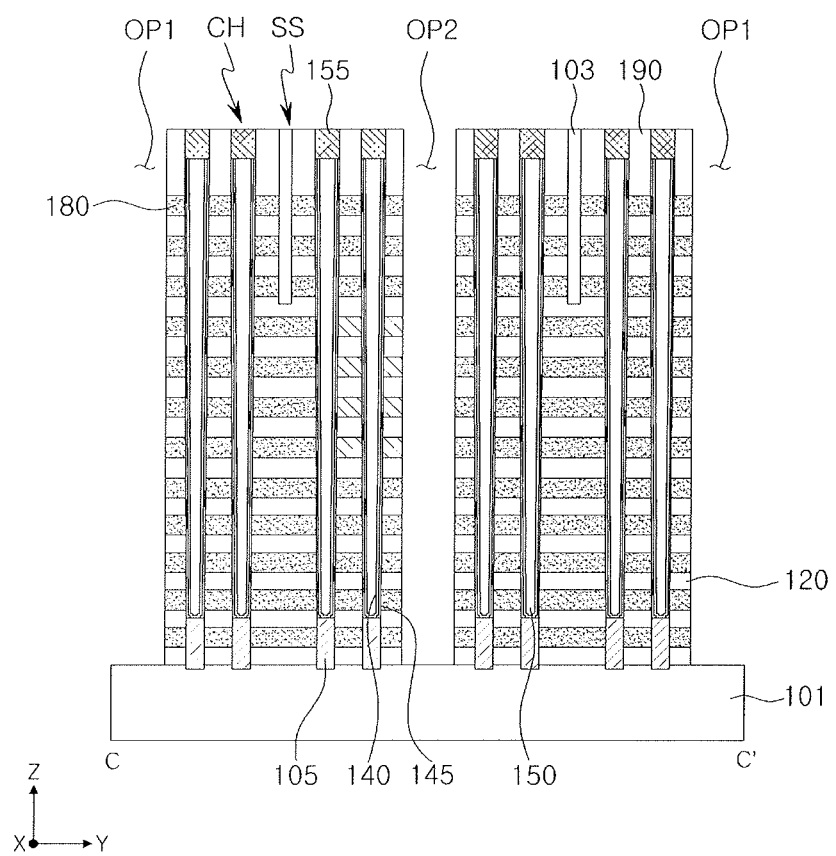

Referring to FIGS. 12A and 12B, first and second openings OP1 and OP2 may be formed to pass through stacked structure of sacrificial layers 180 and interlayer insulation layers 120.

The first and second openings OP1 and OP2 may be formed by forming a mask layer using a photolithography process and anisotropically etching stacked structure. The first and second openings OP1 and OP2 may be formed in a trench form extending in the x direction. The first openings OP1 may extend in a single form in the x direction. The second openings OP2 may be arranged between the first openings OP1, and may be arranged to be spaced apart from each other in a straight line in the x direction. In this operation, the substrate 101 may be exposed on a lower portion of the first and second openings OP1 and OP2.

Figure 13A:
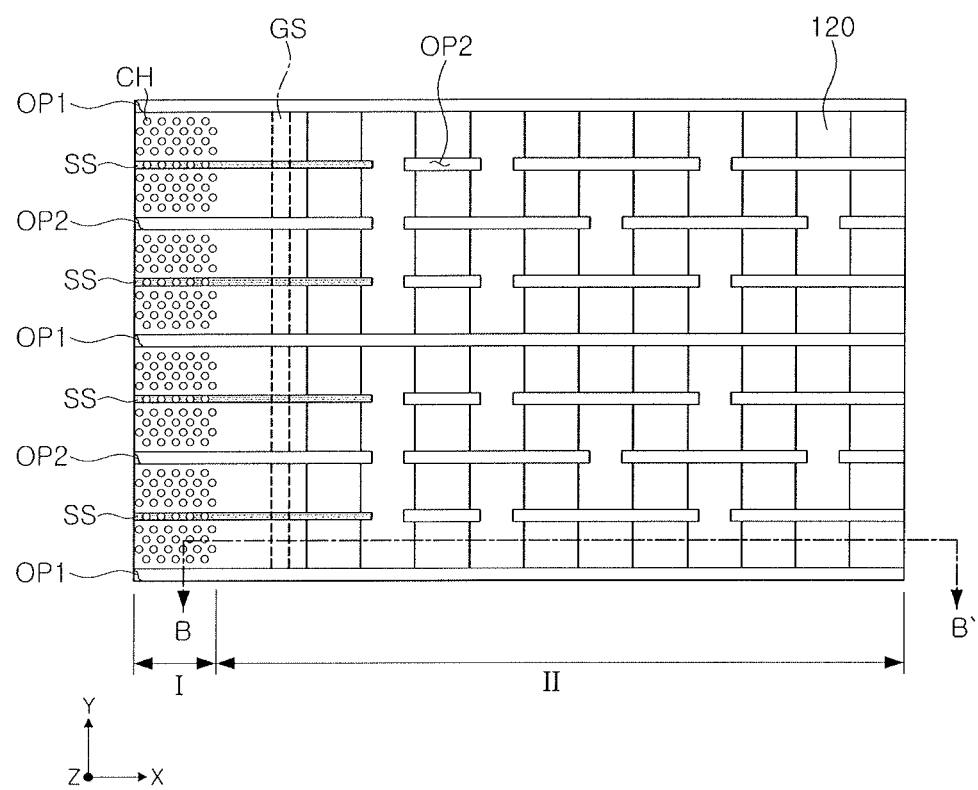
Figure 13B:
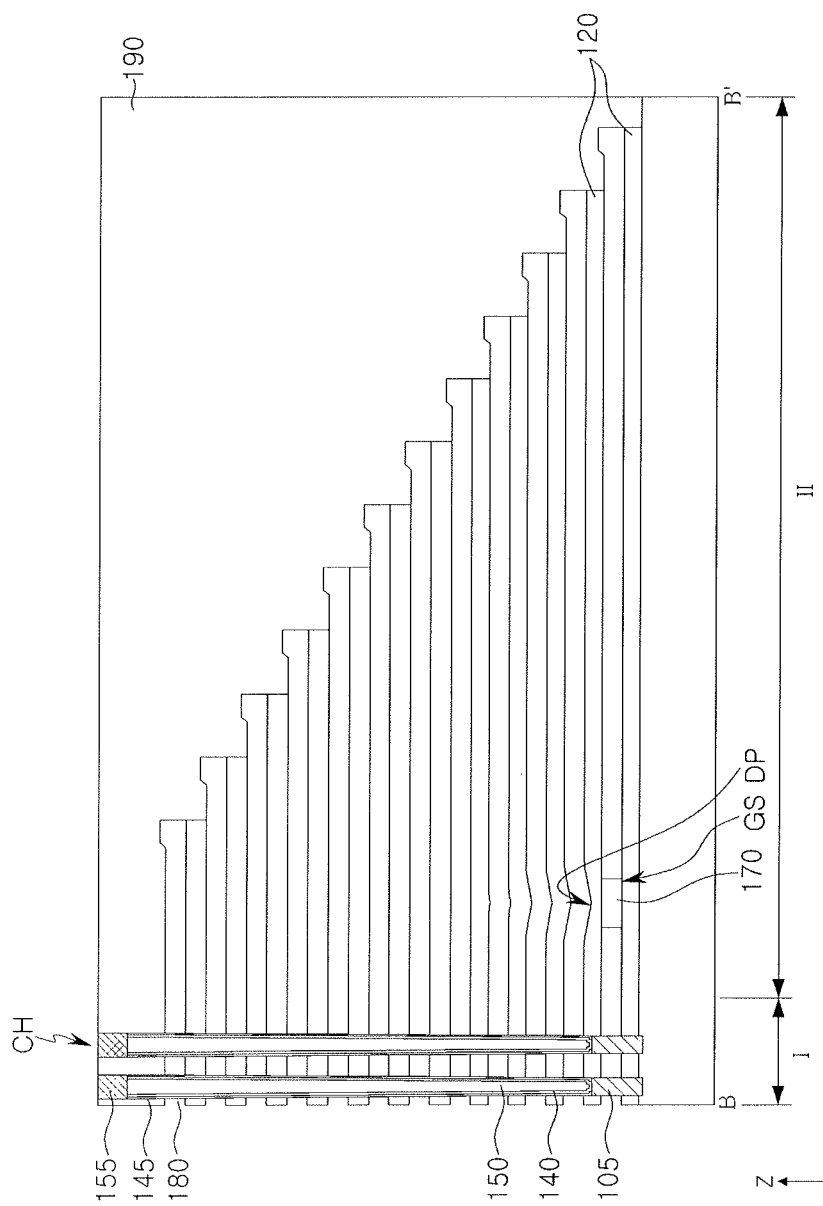

Referring to FIGS. 13A and 13B, the sacrificial layers 180 may be removed through the first and second openings OP1 and OP2. The sacrificial layers 180 may be selectively removed relative to the interlayer insulation layers 120 using, e.g., wet etching. Therefore, a plurality of lateral openings may be formed between the interlayer insulation layers 120, and side walls of the gate dielectric layer 145 of the channels CH and side surfaces of the insulation region GS may be exposed through the lateral openings. In this operation, after the sacrificial layers 180 are removed, a stacked structure of the interlayer insulation layer 120 may be deteriorated in terms of stability, but the stacked structure may be supported more stably by regions between the second openings OP2.

Figure 14A:
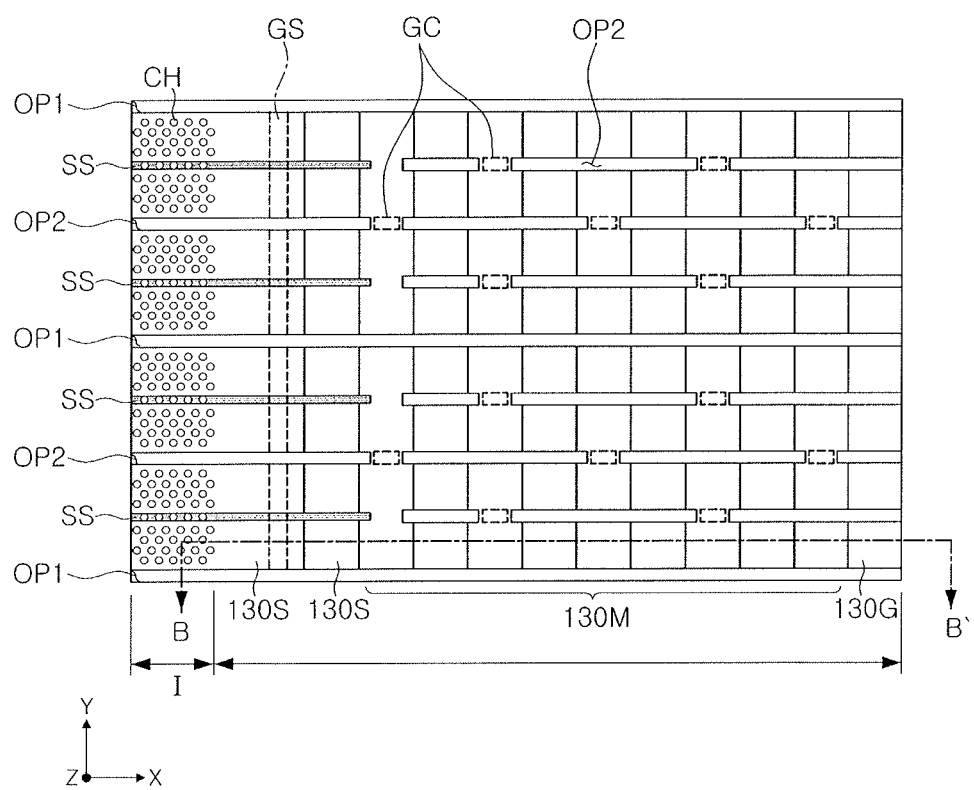
Figure 14B:
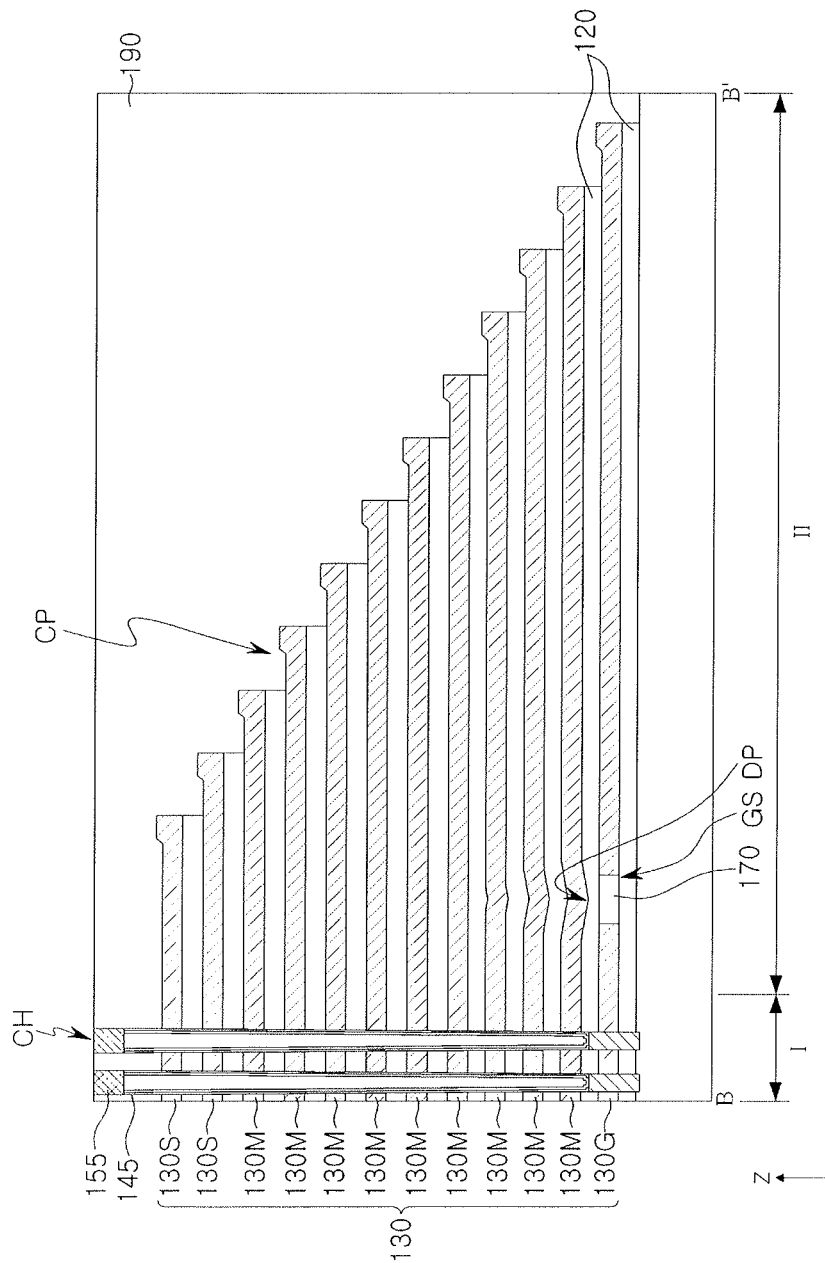

Referring to FIGS. 14A and 14B, the gate electrodes 130 may be formed by filling a conductive material in regions in which sacrificial layers 180 are removed. The gate electrodes 130 may include, e.g., a metal, polycrystalline silicon or metal silicide material.

The second openings OP2 may provide a transfer path of the material for forming the gate electrodes 130, together with the first openings OP1. The gate electrodes 130 may be effectively charged by the second openings OP2, even when a spacing distance of the first openings OP1 in the y direction is relatively long. The gate connection regions GC may be formed between the second openings OP2 arranged in a straight line in the x direction. After the gate electrodes 130 are formed, the material forming the gate electrodes 130 deposited in the first and second openings OP1 and OP2 may be removed through an additional process.

In this embodiment, since the insulation region GS is formed to be spaced apart from the gate connection regions GC, even when the gate connection regions GC are formed in this operation, it may be possible to prevent an occurrence of defects in relation to a depressed portion DP on an upper portion of the insulation region GS.

Figure 15A:
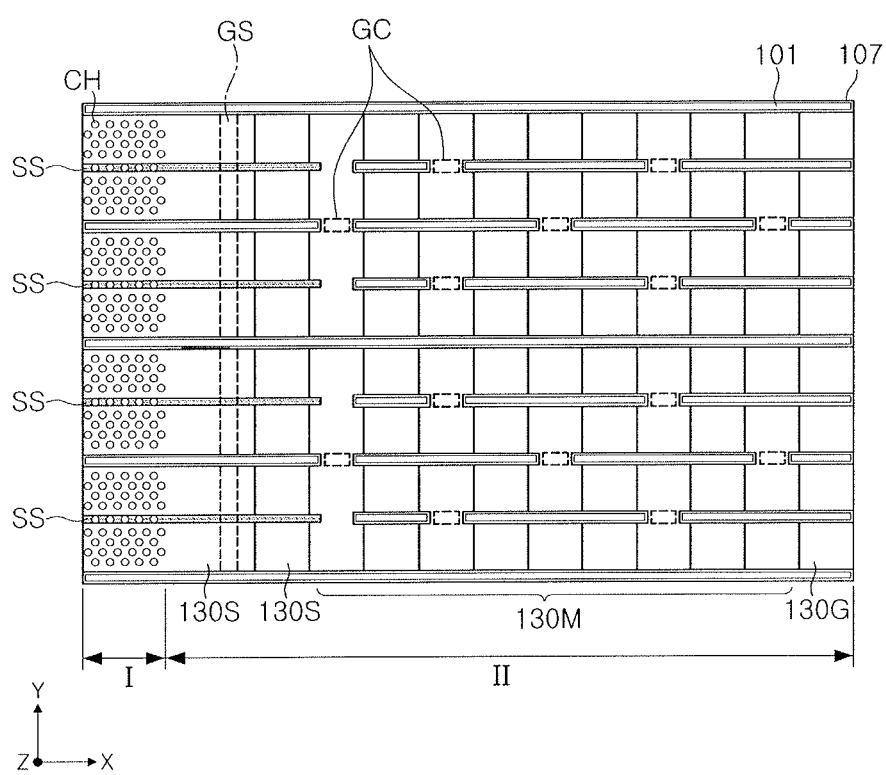
Figure 15B:
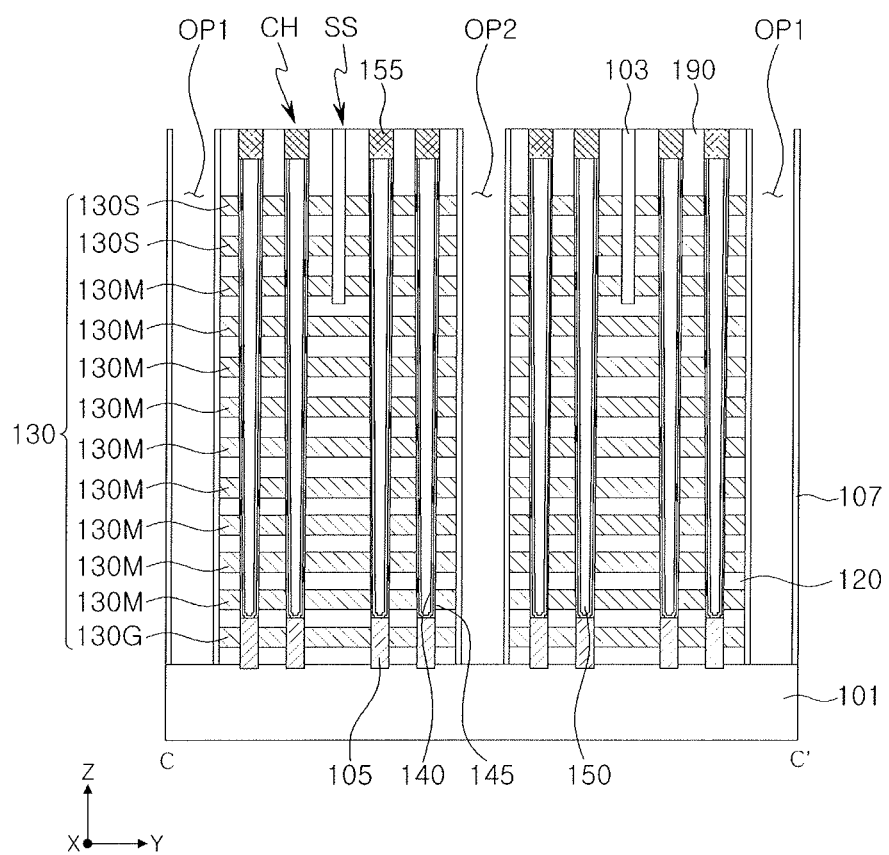

Referring to FIGS. 15A and 15B, the source insulation layer 107 may be formed in the first and second openings OP1 and OP2. The source insulation layer 107 in the first and second openings OP1 and OP2 may be formed in the form of a spacer. That is, after the insulating material is deposited, an insulating material formed on the substrate 101 may be removed from lower portions of the first and second openings OP1 and OP2 to form the source insulation layer 107.

Next, as illustrated in FIGS. 4B and 4C, a conductive material may be deposited on the source insulation layer 107 to form the source conductive layer 110, thereby forming the first and second separation regions MS1, MS2a, and MS2b. The first and second separation regions MS1, MS2a, and MS2b may be formed in the same process to have the same structure. As described above, for example, the first separation regions MS1 may function as the common source line CSL, and the second separation regions MS2a and MS2b may function as the dummy common source line.

By way of summation and review, a semiconductor device with improved reliability may be provided by disposing a gate connecting region to be spaced apart from an insulation region for separating a lowermost gate electrode. That is, the semiconductor device includes the insulation region GS between the channels CH in the first region I and the gate connection regions GC in the second region II, so a contact plug connected to the GSL (lowermost of the gate electrodes 130) is connected to an upper wiring structure in a region sufficiently spaced apart from the gate connection region, e.g., at a side of a pad region opposite the gate connection regions GC.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having first and second regions;
gate electrodes that are stacked to be spaced apart from each other in a first direction perpendicular to an upper surface of the substrate in the first region, the gate electrodes extending by different lengths in a second direction perpendicular to the first direction in the second region;
first separation regions arranged in the first and second regions to pass through the gate electrodes, to extend in the second direction, and to be spaced apart from each other in a third direction perpendicular to the first and second directions;
second separation regions arranged between the first separation regions to pass through the gate electrodes and to extend in the second direction, portions of the second separation regions being spaced apart from each other in the second direction in the second region; and
an insulation region extending in the third direction to separate at least one of the gate electrodes into two portions adjacent to each other in the second direction, wherein the second separation regions include:
second central separation regions arranged in a single form in the first region and arranged to be spaced apart from each other in a straight line in the second region, and
second auxiliary separation regions arranged in the second region only, the insulation region being between the first separation region and the second central separation region extending from the first region.

2. The semiconductor device as claimed in claim 1, wherein the second separation regions are arranged to be spaced apart from each other in the second direction with gate connection regions therebetween, and the insulation region is spaced apart from the gate connection regions.

3. The semiconductor device as claimed in claim 2, wherein the insulation region is in the second region between the first region and a gate connection region of the gate connection regions that is closest to the first region.

4. The semiconductor device as claimed in claim 1, wherein a lowermost Rate electrode of the gate electrodes is separated in the second direction by the insulation region, and is separated in the third direction by a second separation region of the second separation regions.

5. The semiconductor device as claimed in claim 1, wherein the insulation region includes a plurality of insulation regions arranged in a straight line in the third direction.

6. The semiconductor device as claimed in claim 1, wherein the insulation region includes a plurality of insulation regions arranged in a zigzag pattern in the third direction.

7. The semiconductor device as claimed in claim 1, wherein side surfaces of the insulation region in the third direction are in contact with at least one of the first separation regions or the second separation regions.

8. The semiconductor device as claimed in claim 1, wherein the second separation regions are spaced apart from each other in the third direction between a pair of the first separation regions to be arranged in a plurality of rows.

9. The semiconductor device as claimed in claim 1, wherein a lower gate electrode of the gate electrodes extends longer than an upper gate electrode of the gate electrodes in the second direction to provide contact regions, and the semiconductor device further includes contact plugs connected to the gate electrodes in the contact regions.

10. The semiconductor device as claimed in claim 9, wherein:
the second region of the substrate includes two second regions on opposite sides of the first region,
the insulation region is on a first of the two second regions, and
at least one of the gate electrodes separated by the insulation region is connected to contact plugs on a second of the two second regions, the contact plugs being spaced apart from the insulation region.

11. The semiconductor device as claimed in claim 9, wherein the insulation region is on a lower portion of at least one of the contact regions.

12. The semiconductor device as claimed in claim 1, wherein the first and second separation regions have a same structure.

13. The semiconductor device as claimed in claim 1, further comprising an upper insulation region that extends in the second direction to separate at least one of the gate electrodes disposed at a top portion of the gate electrodes, and is disposed in a straight line with a portion of the second separation regions.

14. The semiconductor device as claimed in, claim 13, wherein the insulation region has a region overlapping with the upper insulation region in a plane.

15. A semiconductor device, comprising:
memory gate electrodes that are stacked to be spaced apart from each other in a first direction perpendicular to an upper surface of a substrate, the memory gate electrodes extending by different lengths in a second direction perpendicular to the first direction;
at least one lower gate electrode between the substrate and, the memory gate electrodes;
first separation regions arranged to pass through the memory gate electrodes; and the at least one lower, gate electrode, to extend in the second direction, and to be spaced apart from each other in a third direction perpendicular to the first and second directions;
second separation regions arranged between the first separation regions to pass through the memory gate electrodes and the at least one lower gate electrode, to extend in parallel with the first separation regions, as viewed in a top view, and arranged to be spaced apart from each other in the second direction with a gate connection region therebetween; and an insulation region completely separating the at least one lower gate electrode in the second direction, between a first separation region of the first separation regions and a second separation region of the second separation regions which are adjacent to each other in the third direction.

16. The semiconductor device as claimed in claim 15, wherein:
the insulation region has a linear shape, as viewed in the top view, the linear shape of the insulation region being perpendicular to linear shapes of die first and second separation regions, as viewed in the top view, and
the insulation region is spaced apart from the gate connection region.

17. The semiconductor device as claimed in claim 15, wherein the at least one lower Rate electrode includes two or more sub-gate electrodes having no gate connection region.

18. The semiconductor device as claimed in claim 15, wherein the at least one lower gate electrode includes sub-gate electrodes, and at least one of the sub-gate electrodes is a dummy sub-gate electrode to which an electrical signal is not applied.

* * * * *